(12) United States Patent
Kontani

(10) Patent No.: US 10,725,557 B2
(45) Date of Patent: Jul. 28, 2020

(54) INPUT DEVICE

(71) Applicant: PANASONIC INTELLECTUAL PROPERTY MANAGEMENT CO., LTD., Osaka (JP)

(72) Inventor: Masaki Kontani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/272,533

(22) Filed: Feb. 11, 2019

(65) Prior Publication Data

US 2019/0267996 A1  Aug. 29, 2019

(30) Foreign Application Priority Data

Feb. 23, 2018 (JP) .................................. 2018-031103

(51) Int. Cl.
*G06F 3/02* (2006.01)
*H03K 17/96* (2006.01)
(Continued)

(52) U.S. Cl.
CPC ............ *G06F 3/0219* (2013.01); *B60K 35/00* (2013.01); *B62D 1/04* (2013.01); *B62D 1/046* (2013.01);
(Continued)

(58) Field of Classification Search
CPC .......... B60K 2370/34; B60K 2370/345; B60K 37/06; B60Q 3/14; G09G 3/045;
(Continued)

(56) References Cited

U.S. PATENT DOCUMENTS 3,893,092 A * 7/1975 Kessler .................. G08B 25/14
340/502
4,277,665 A * 7/1981 Kondo ..................... H01H 9/16
200/311

(Continued)

FOREIGN PATENT DOCUMENTS

JP   2007-080789 A   3/2007
JP   2012-163961 A   8/2012
(Continued)

OTHER PUBLICATIONS

U.S. Appl. No. 16/267,478 to Yuma Sasagawa et al., filed Feb. 5, 2019.

(Continued)

*Primary Examiner* — Sanjiv D. Patel
(74) *Attorney, Agent, or Firm* — Greenblum & Bernstein, P.L.C.

(57) ABSTRACT

An input device is provided which includes: a first light source which emits light to cause a first design to be displayed on a display region: a second light source which emits light to cause a second design different from the first design to be displayed on the display region; a switch which receives an input from a user; and a control circuit which, according to the input received by the switch, (i) controls displaying of a design on the display region, by controlling a lighting state of the first light source and a lighting state of the second light source, and (ii) outputs a control signal corresponding to the input received by the switch, to an external device.

13 Claims, 19 Drawing Sheets

(51) Int. Cl.
*B60K 35/00* (2006.01)
*B62D 1/04* (2006.01)
*G06F 3/042* (2006.01)
*H01H 13/02* (2006.01)

(52) U.S. Cl.
CPC ....... *G06F 3/0421* (2013.01); *H03K 17/9631* (2013.01); *H01H 2013/026* (2013.01)

(58) Field of Classification Search
CPC ............ H01H 13/023; H01H 2219/039; G06F 3/044; G06F 3/0416; G06F 3/0412; G06F 3/0482; G06F 3/04847; H03K 17/962; H03K 17/9622; H03K 17/955; H03K 17/96
See application file for complete search history.

(56) References Cited

U.S. PATENT DOCUMENTS

| | | | |
|---|---|---|---|
| 4,395,611 A * | 7/1983 | Kondo | H01H 13/023 200/311 |
| 7,581,342 B2 * | 9/2009 | Egami | G09F 13/22 340/815.44 |
| 10,397,995 B2 * | 8/2019 | Kontani | G02B 6/0031 |
| 2012/0200475 A1 * | 8/2012 | Baker | G09F 13/04 345/4 |
| 2016/0202894 A1 * | 7/2016 | Kim | G06F 3/04842 715/716 |
| 2016/0272111 A1 * | 9/2016 | Teng | H01H 9/181 |
| 2019/0082506 A1 | 3/2019 | Kontani et al. | |
| 2019/0129573 A1 | 5/2019 | Sasagawa et al. | |

FOREIGN PATENT DOCUMENTS

| | | |
|---|---|---|
| JP | 6173580 B2 | 4/2015 |
| WO | 2015/056046 A1 | 4/2015 |

OTHER PUBLICATIONS

U.S. Appl. No. 16/096,283 to Masaki Kontani et al., filed Oct. 24, 2018.

* cited by examiner

INPUT DEVICE

CROSS REFERENCE TO RELATED APPLICATION

The present application is based on and claims priority of Japanese Patent Application No. 2018-031103 filed on Feb. 23, 2018.

BACKGROUND

1. Technical Field

The present disclosure relates to an input device.

2. Description of the Related Art

Japanese Unexamined Patent Application Publication No. 2007-80789 discloses a display device which selectively displays one of two graphics by switching between lighting-up of a first light source and lighting-up of a second light source, according to a selected function.

SUMMARY

However, the display device disclosed by Japanese Unexamined Patent Application Publication No. 2007-80789 can be improved upon.

In view of this, the present disclosure provides an input device which is capable of improving upon the above related art.

An input device according to one aspect of the present disclosure includes: a first light source which emits light to cause a first design to be displayed on a display region; a second light source which emits light to cause a second design different from the first design to be displayed on the display region; a switch which receives an input from a user; and a control circuit which, according to the input received by the switch, (i) controls displaying of a design on the display region, by controlling a lighting state of the first light source and a lighting state of the second light source, and (ii) outputs a control signal corresponding to the input received by the switch, to an external device.

The input device according to one aspect of the present disclosure is capable of improving upon the above related art.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

Figure 1:
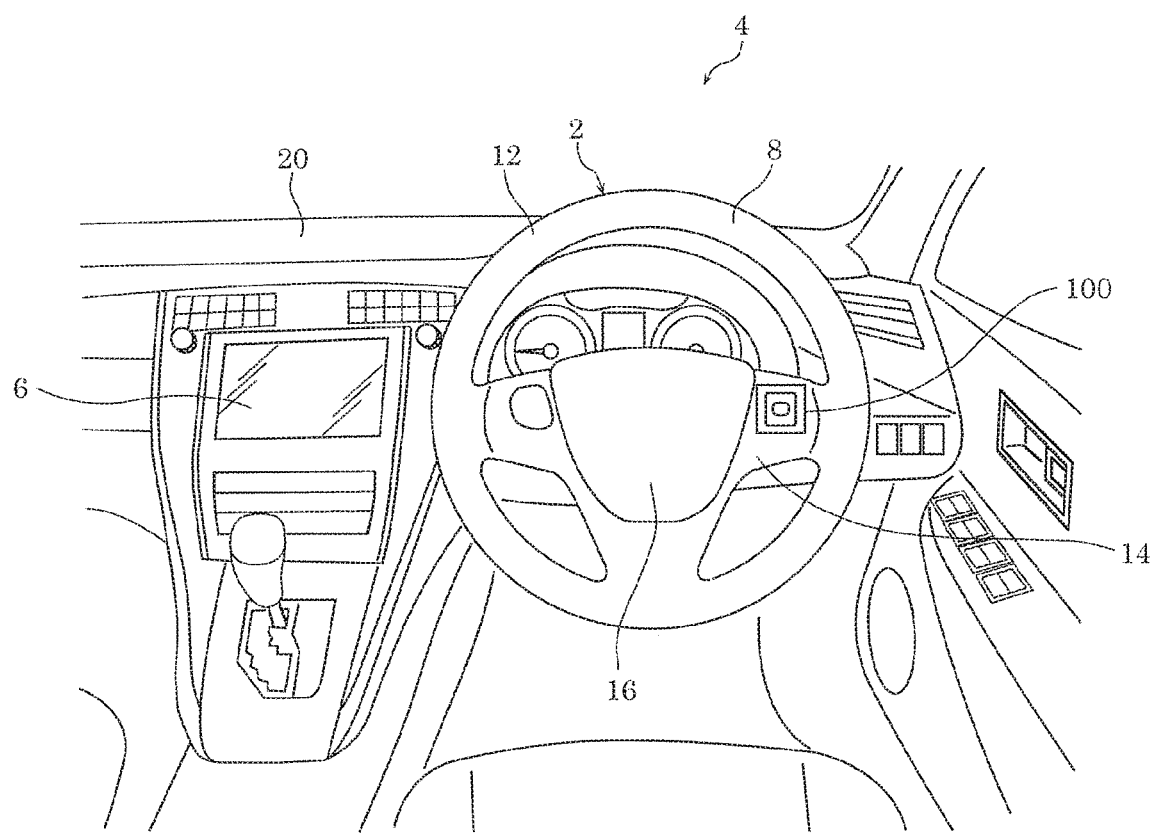
FIG. 1 is a diagram which illustrates one example of a vehicle interior of a vehicle in which a steering input device according to an embodiment is installed.

DETAILED DESCRIPTION OF THE EMBODIMENT (Underlying Knowledge Forming the Basis of the Present Disclosure)

The inventor found that the following problems occur with the display device described in the "Description of the Related Art" section.

The display device according to Japanese Unexamined Patent Application Publication No. 2007-80789 fails to disclose how a function is selected. Accordingly, there is a problem that, when a user presses a switch for selecting a function, it is difficult for the user to figure out to what image the display will be switched, what function will be selected, etc. In particular, when such a display device is included in an input device for selecting a function of a vehicle, a user performs an intended input while the user is driving the vehicle, and thus another problem of a false operation is likely to occur due to the above-described problem.

In view of the above, the present disclosure provides an input device capable of reducing a false operation by a user.

In order to solve the above-described problems, the input device according to one aspect of present disclosure includes: a first light source which emits light to cause a first design to be displayed on a display region; a second light source which emits light to cause a second design different from the first design to be displayed on the display region; a switch which receives an input from a user; and a control circuit which, according to the input received by the switch, (i) controls displaying of a design on the display region, by controlling a lighting state of the first light source and a lighting state of the second light source, and (ii) outputs a control signal corresponding to the input received by the switch, to an external device.

According to this configuration, the control circuit controls displaying of a design on the display region, by controlling the lighting state of the first light source and the lighting state of the second light source according to an input received by the switch. In addition, the control circuit outputs a control signal corresponding to the input, to the external device. Accordingly, a user can perform input on a desired switch, and cause the external device to carry out an intended operation. It is thus possible to reduce false operations by the user.

In addition, the external device may operate in one of a first operation mode and a second operation mode, the first design may indicate that an operation mode of the external device is to be switched to the first operation mode when the input is received next time by the switch, and when the switch receives the input while the first light source is in an on-state, the control circuit may (i) turn off display of the first design by switching the lighting state of the first light source from the on-state to an off-state, and (ii) output the control signal for switching the operation mode to the first operation mode, to the external device.

According to this configuration, the input device displays a design which indicates an operation mode to be switched to when the switch receives an input next time. Accordingly, it is possible for a user to know that the operation mode will be switched, when the user performs next time an input on the switch, to an operation mode indicated by the design currently displayed. Accordingly, the user can perform an input on a desired switch, and easily cause the external device to carry out an intended operation.

In addition, the external device may operate in one of a first operation mode and a second operation mode, the first design may indicate that the external device is currently operating in the first operation mode, the second design may indicate that the external device is currently operating in the second operation mode, and when the switch receives the input while the first light source is in an on-state, the control circuit may (i) switch a design displayed on the display region from the first design to the second design, by switching the lighting state of the first light source from the on-state to an off-state and switching the lighting state of the second light source from the off-state to the on-state, and (ii) output the control signal for switching the operation mode to the second operation mode, to the external device.

According to this configuration, the input device displays a design indicating a current operation mode, of two operation modes of the external device, and does not display an operation mode different from the current operation mode. Accordingly, it is possible for a user to know that the operation mode will be switched, when the user performs next time an input on the switch, to the other operation mode different from the operation mode currently displayed. Accordingly, it is possible for the user to perform an input on a desired switch, and easily cause the external device to carry out an intended operation.

In addition, the external device may operate in one of a first operation mode and a second operation mode, the first design may indicate that the external device is currently operating in the first operation mode, the second design may indicate that the external device is currently operating in the second operation mode, and when the switch receives the input while the first design and the second design are displayed with emphasis on the first design, the control circuit may (i) switch a design displayed with emphasis from the first design to the second design, and (ii) output the control signal for switching the operation mode to the second operation mode, to the external device.

According to this configuration, the input device displays the design indicating a current operation mode, of two operation modes of the external device, with greater emphasis than the design indicating an operation mode different from the current operation mode. Accordingly, a user can easily know both the current operation mode and the operation mode to be switched to when the switch receives an input next time. Accordingly, it is possible for the user to perform an input on a desired switch, and easily cause the external device to carry out an intended operation.

In addition, the control circuit may switch the design displayed with emphasis on the display region from the first design to the second design, by switching the lighting state of the first light source and the lighting state of the second light source from a first state to a second state, the first state being a state in which the first light source is caused to emit light having a color or luminance with greater emphasis than a color or luminance of light emitted by the second light source, the second state being a state in which the second light source is caused to emit light having a color or luminance with greater emphasis than a color or luminance of light emitted by the first light source.

Accordingly, it is possible for a user to easily distinguish between a design displayed with emphasis and a design displayed without emphasis.

In addition, the external device may operate in one of a first operation mode and a second operation mode, the first design may indicate that a first control in the first operation mode is to be executed by the external device, the second design may indicate that a second control in the second operation mode is to be executed by the external device, and while the first light source is in an on-state, the control circuit may: (i) when the switch receives an input by being continuously pressed or touched for a predetermined period or longer, (i-i) switch a design displayed on the display region from the first design to the second design, by switching the lighting state of the first light source from the on-state to an off-state and switching the lighting state of the second light source from the off-state to the on-state, and (i-ii) output a control signal for switching the operation mode to the second operation mode, to the external device; and (ii) when the switch receives an input by being continuously pressed or touched for less than the predetermined period, output a control signal for causing the first control to be executed, to the external device.

According to this configuration, the input device switches between switching an operation mode of the external device and causing the external device to execute the first control, depending on whether the switch is continuously pressed or touched for a predetermined period or longer or the switch is continuously pressed or touched for less than the predetermined period. Accordingly, it is not necessary to separately include a switch for switching between the operation modes, making it possible to reduce the number of switches.

In addition, the external device may be placed in one of a first operational state and a second operational state, the first design may indicate that an operational state of the external device is currently the first operational state, the second design may indicate that the operational state of the external device is currently the second operational state, and when the switch receives the input while the first light source is in an on-state, the control circuit may (i) switch a design displayed on the display region from the first design to the second design indicating the second operational state, by switching the lighting state of the first light source from the on-state to an off-state and switching the lighting state of the second light source from the off-state to the on-state, and (ii) output the control signal for switching the operational state to the second operational state, to the external device.

According to this configuration, the input device displays a design which indicates an operational state to be switched to when the switch receives an input next time. Accordingly, it is possible for a user to know that the operation mode will be switched, when the user performs next time an input on the switch, to the operational state indicated by the design currently displayed. Accordingly, a user can easily perform input on a desired switch, and cause the external device to carry out an intended operation.

In addition, the input device may further include an anomaly detector which detects occurrence of a predetermined anomaly. When the anomaly detector detects the predetermined anomaly, the control circuit may cause the second design which indicates the occurrence of the predetermined anomaly to be displayed on the display region, by switching the lighting state of the second light source from an off-state to an on-state.

Accordingly, the second design can be displayed together with the first design, and thus it is possible to notify a user of occurrence of the predetermined anomaly in the operation mode, the operational state, etc. indicated by the first design.

In addition, the control circuit may cause the second design to be displayed with emphasis.

In this manner, it is possible to effectively notify a user of occurrence of the predetermined anomaly.

In addition, the control circuit may cause the second design to be displayed with emphasis, by causing the second light source to flash or emit light having a color or luminance with greater emphasis than a color or luminance of light emitted by the first light source.

In this manner, it is possible to effectively notify a user of occurrence of the predetermined anomaly.

In addition, the input device may further include: an anomaly detector which detects occurrence of a predetermined anomaly. When the anomaly detector detects the predetermined anomaly, the control circuit may execute one of (i) causing the first light source and the second light source to concurrently emit light, (ii) causing the first light source and the second light source to concurrently flash, and (iii) causing the first light source and the second light source to alternately flash.

In this manner, it is possible to effectively notify a user of occurrence of the predetermined anomaly.

In addition, the display device may include the first light source and the second light source is formed independently of the switch, and the display device may communicate with the switch to receive an input signal indicating an input to the switch.

In addition, the switch may be disposed inside the display device including the first light source and the second light source.

Embodiment (1-1. Configuration of Steering Input Device)

Figure 2:
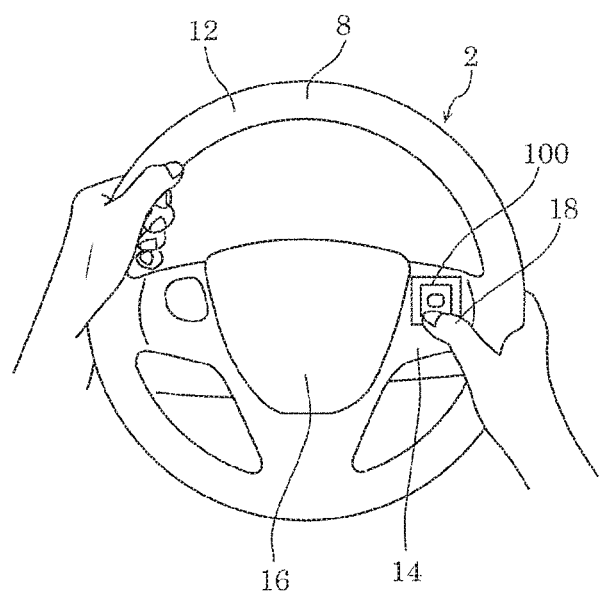
FIG. 2 is a diagram which illustrates a use example of the steering input device according to the embodiment.

First, a configuration of steering input device 2 according to an embodiment will be described with reference to FIG. 1 and FIG. 2. FIG. 1 is a diagram which illustrates an example of a vehicle interior of a vehicle in which steering input device 2 according to the embodiment is installed. FIG. 2 is a diagram which illustrates a use example of steering input device 2 according to the embodiment.

In the vehicle interior of automobile 4 (one example of the vehicle) illustrated in FIG. 1, steering input device 2 and on-vehicle device 6 are installed. Steering input device 2 according to the embodiment includes steering wheel 8 and input device 100.

Steering wheel 8 is for steering automobile 4. Steering wheel 8 includes rim 12 having a ring shape, spoke 14 having a substantially T-shape and formed integrally with rim 12 on an inner circumference surface of rim 12, and horn switch cover 16 which covers a horn switch (not illustrated) disposed at a center portion of spoke 14.

Input device 100 is for operating on-vehicle device 6, and is disposed on spoke 14 of steering wheel 8, for example. As illustrated in FIG. 2, a driver who is a user of input device 100 performs an input operation on input device 100 with finger 18 (one example of an operator object) of right hand gripping rim 12, thereby operating on-vehicle device 6. A configuration of input device 100 will be described later in detail.

On-vehicle device 6 is, for example, an audio device for reproducing an optical disc such as a compact disc, etc. On-vehicle device 6 is placed in dashboard 20, for example. A configuration of on-vehicle device 6 will be described later in detail.

(1-2. Configuration of Input Device)

Figure 3:
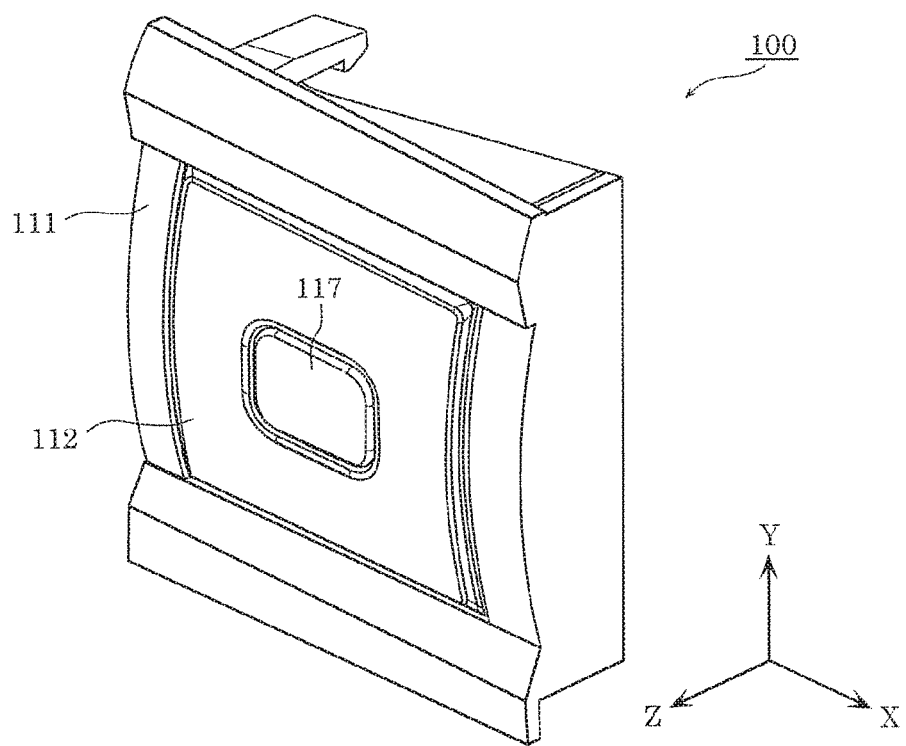
FIG. 3 is an external perspective view of an input device according to the embodiment.
Figure 4:
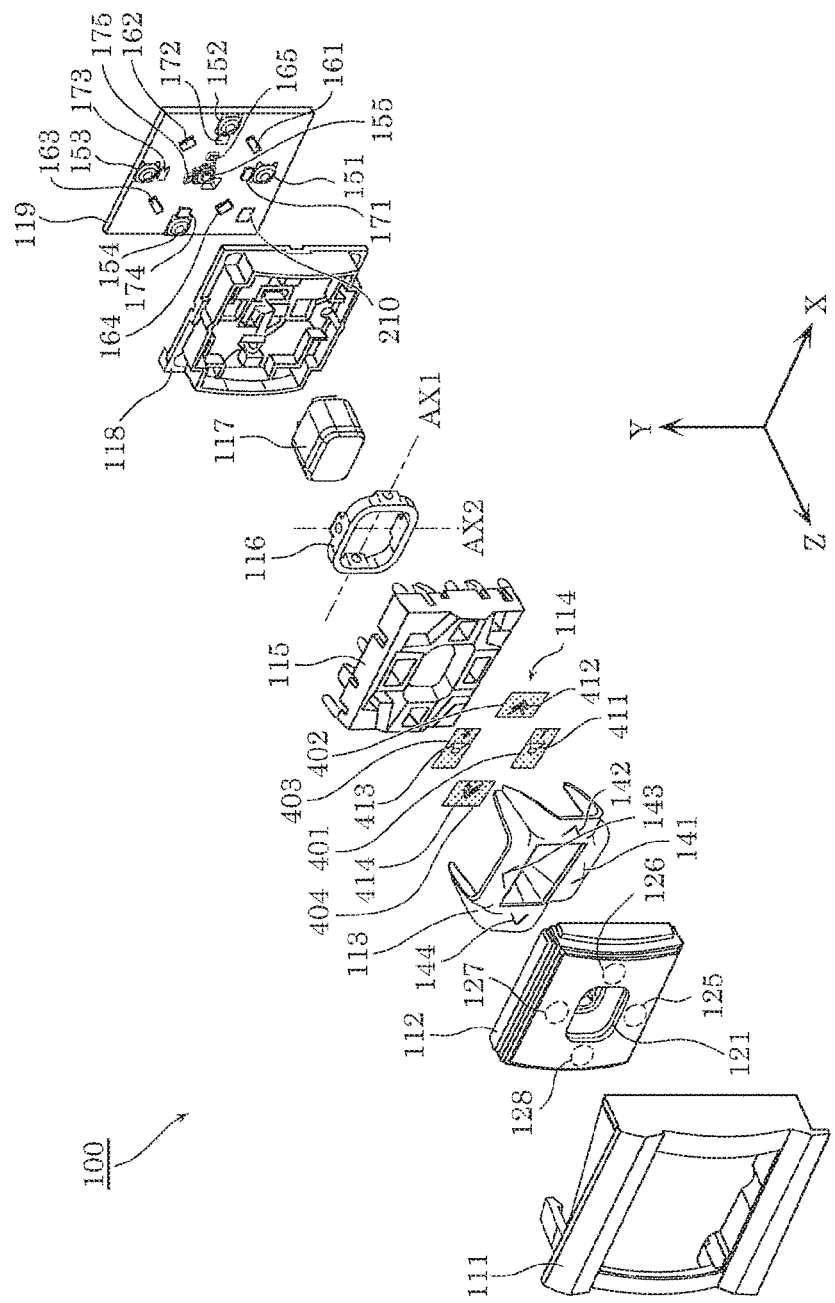
FIG. 4 is an exploded perspective view of the input device according to the embodiment.

The following describes a configuration of input device 100 according to the embodiment, with reference to FIG. 3 and FIG. 4. FIG. 3 illustrates an external perspective view of input device 100 according to the embodiment.

FIG. 4 illustrates an exploded perspective view of input device 100 according to the embodiment.

As illustrated in FIG. 3 and FIG. 4, input device 100 according to the embodiment includes: housing 111; first operation unit 112; light guide body 113; mask body 114; first supporter 115; shaft body 116; second operation unit 117; second supporter 118; and board 119.

Housing 111 is a component which is disposed on a front-surface side (a Z-axis positive side) of input device 100.

First operation unit 112 is a component which is operated by the driver to selectively press any one of four switches 151 to 154 mounted on board 119 disposed on a rear-surface side (a Z-axis negative side). First operation unit 112 is swingably supported biaxially by first supporter 115, shaft body 116, and second supporter 118. More specifically, first operation unit 112 is swingably supported about an axis parallel to the X-axis direction and an axis parallel to the Y-axis direction.

For example, first operation unit 112 includes portion 125 located on a Y-axis negative side, portion 126 located on an X-axis positive side, portion 127 located on a Y-axis positive side, and portion 128 located on an X-axis negative side. When portion 125 is pressed by the driver, portion 125 swings about first axis AX1 parallel to the X-axis direction of shaft body 116, and presses switch 151 which is disposed on board 119 at a position corresponding to portion 125. When portion 126 of first operation unit 112 is pressed by the driver, portion 126 swings about second axis AX2 parallel to the Y-axis direction of shaft body 116, and presses switch 152 which is disposed on board 119 at a position corresponding to portion 126. In the same manner as above, when portion 127 of first operation unit 112 is pressed, portion 127 presses switch 153 located at a position corresponding to portion 127, and when portion 128 of first operation unit 112 is pressed, portion 128 presses switch 154 located at a position corresponding to portion 128.

First operation unit 112 includes opening 121 at the center, and second operation unit 117 is disposed in opening 121.

Light guide body 113 guides light emitted by first light sources 161 to 164 mounted on board 119, in a direction (the positive direction of the Z-axis) opposite to a direction in which switches 151 to 154 are pressed (the negative direction of the Z-axis), such that the light is emitted from positions corresponding to switches 151 to 154. Specifically, light guide body 113 is disposed forward of board 119 (on the Z-axis positive side). Light guide body 113 is formed using a transparent material, such as an acrylic resin, a polycarbonate resin, etc.

Light guide body 113 includes four first design portions which correspond to first designs 141 to 144 (see description below), and are formed at four positions respectively corresponding to four portions 125 to 128 of first operation unit 112. Light guide body 113 reflects light emitted by first light sources 161 to 164 at the four first design portions, in the positive direction of the Z-axis. More specifically, when first light sources 161 to 164 emit light, four first designs 141 to 144 are respectively displayed on the four portions 125 to 128 of first operation unit 112 of input device 100. In other words, first light sources 161 to 164 emit light to cause the four first designs 141 to 144 to be respectively displayed on the four portions 125 to 128 that serve as display regions.

Mask body 114 comprises four mask parts 401 to 404 each having a substantially rectangular plate shape. The four mask parts 401 to 404 respectively transmit, in the positive direction of the Z-axis, light emitted by second light sources 171 to 174 mounted on board 119, through light-transmissive portions having the shapes of second designs 411 to 414, and block the light by light-blocking portions other than the light-transmissive portions. In this manner, when second light sources 171 to 174 emit light, the four second designs 411 to 414 are respectively displayed on the four portions 125 to 128 of first operation unit 112 of input device 100. In other words, second light sources 171 to 174 emit light to cause the four second designs 411 to 414 to be respectively displayed on the four portions 125 to 128 that serve as display regions. It should be noted that second designs 411 to 414 have shapes different from shapes of first designs 141 to 144.

First supporter 115 is a component which supports first operation unit 112 and light guide body 113. In addition, first supporter 115 swingably supports shaft body 116 about second axis AX2.

Second supporter 118 is a component which supports second operation unit 117. In addition, second supporter 118 swingably supports shaft body 116 about first axis AX1.

First supporter 115 and second supporter 118 are arranged so as to mutually avoid interference. Accordingly, first supporter 115 is capable of biaxially swinging with shaft body 116 being present with respect to second supporter 118. Thus, first operation unit 112 is capable of biaxially swinging with respect to second supporter 118.

Second operation unit 117 is supported slidably along the Z-axis relative to second supporter 118, and presses switch 155 disposed at the center of board 119 when pressed in the negative direction of the Z-axis.

First supporter 115, shaft body 116, second operation unit 117, and second supporter 118 are formed using, for example, an opaque resin.

Board 119 is a wiring board which includes switches 151 to 155, first tight sources 161 to 165, and second light sources 171 to 175. Switches 151 to 155, first light sources 161 to 165, and second light sources 171 to 175 are mounted on a main surface of board 119. The main surface of board 119 faces a front surface side (the Z-axis positive side). Accordingly, it is possible to dispose switches 151 to 155, first light sources 161 to 165, and second light sources 171 to 175 with a simple configuration. It should be noted that board 119 may further include control circuit 210.

Each of switches 151 to 155 receives an input from a user, by being pressed by a user. It should be noted that each of switches 151 to 155 may receive a touch input from a user, by being touched by the user.

The four first light sources 161 to 164 are disposed so as to respectively correspond to four light guide legs of light guide body 113. The four first light sources 161 to 164 are disposed in an annular shape. Likewise, first light source 165 is disposed to correspond to light guide body 520 which guides light to second operation unit 117 and will be described later, and second light source 175 is disposed to face second operation unit 117 and correspond to mask body 550 which will be described later. Each of first light sources 161 to 165 and second light sources 171 to 175 includes a light emitting element, such as a light emitting diode (LED). Each of first light sources 161 to 165 and second light sources 171 to 175 may include an organic electroluminescence, a light bulb, etc.

Switches 151 to 155 are disposed at mutually different positions on the main surface (i.e., the front surface) of board 119. Likewise, first light sources 161 to 165 and second light sources 171 to 175 are disposed at mutually different positions on the main surface of board 119.

It should be noted that first operation unit 112 is formed using a light-transmissive material such as resin. First operation unit 112 may be colored to have a smoke color. With this configuration, it is possible to cause light reflected by the first design portions corresponding to first designs 141 to 144 formed on light guide body 113 or light transmitted through the light-transmissive portions having the shapes of second designs 411 to 414 to be emitted in the positive direction of the Z-axis when first light sources 161 to 164 or second light sources 171 to 174 mounted on board 119 emit light, and it is possible to reduce the possibility of internal components being visually recognized by a driver when first light sources 161 to 164 or second light sources 171 to 174 do not emit light.

(1-3. Configuration of Second Operation Unit)

The following describes a detailed configuration of second operation unit 117.

Figure 5:
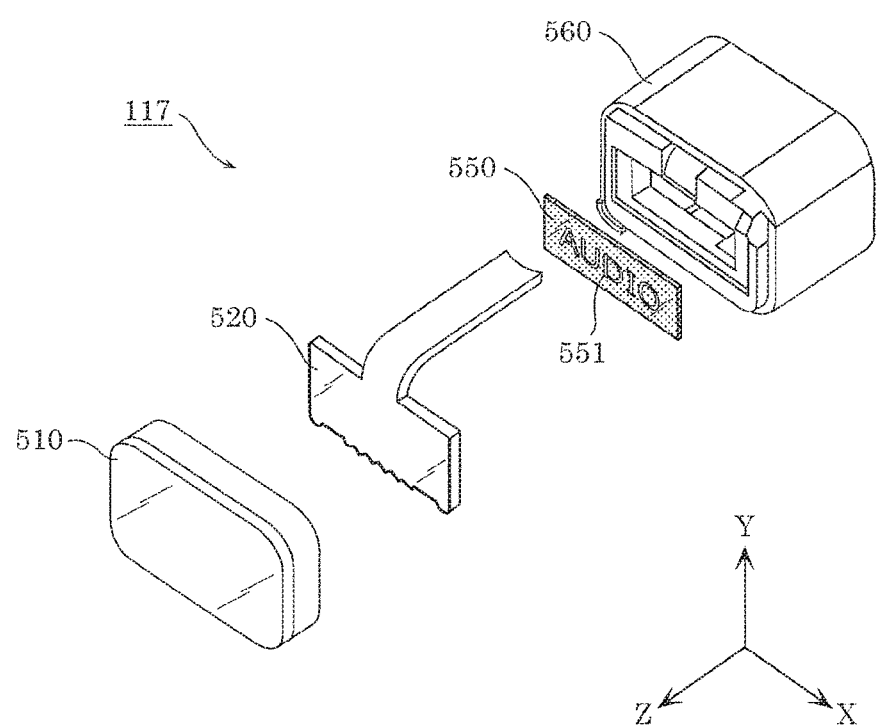
FIG. 5 is an exploded perspective view of a second operation unit.
Figure 6:
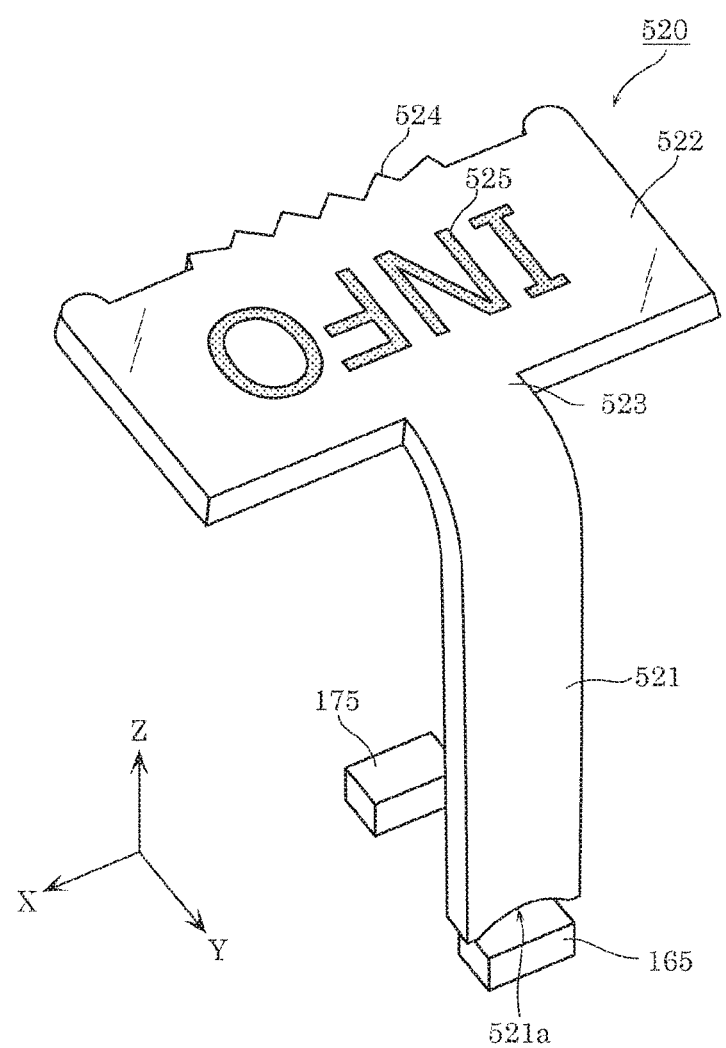
FIG. 6 is an external perspective view of a light guide body.

FIG. 5 is an exploded perspective view of the second operation unit. FIG. 6 illustrates an external perspective view of light guide body 520.

Second operation unit 117 includes front face 510, light guide body 520, mask body 550, and slider portion 560.

Front face 510 is a component which is disposed on the front-surface side (the Z-axis positive side) of second operation unit 117. Front face 510 is disposed on the Z-axis positive side with respect to light guide body 520. Front face 510 is formed using a transparent material which transmits light guided by light guide body 520 in the direction opposite to the direction in which switch 155 is pressed, as with first operation unit 112.

Light guide body 520 reflects, in the positive direction of the Z-axis, light emitted by first light source 165 mounted on board 119, at a first design portion which corresponds to first design 525, and is formed at a position corresponding to front face 510. Accordingly, when first light source 165 emits light, first design 525 is displayed on front face 510 of second operation unit 117. In other words, first light source 165 emits light to cause first design 525 to be displayed on front face 510 that serves as a display region. Specifically, light guide body 520 is disposed forward of board 119 (i.e., on the Z-axis positive side). Light guide body 520 is formed using a transparent material, such as an acrylic resin, a polycarbonate resin, etc.

Light guide body 520 includes light guide leg 521 as a light entrance portion, and light emission portion 522.

Light emitted by first light source 165 enters light guide leg 521. Light emitted by first light source 165 enters light guide leg 521 through light entrance surface 521a that is end surface on the Z-axis negative side. Light entrance surface 521a faces first light source 165. Light guide leg 521 is a portion extending from light source 165 to light emission portion 522 and connected to light emission portion 522.

Light emission portion 522 is a plate-shaped portion which guides, to the Y-axis negative side, light entering through connecting portion 523 at which light guide leg 521 is connected, and reflects the guided light to the Z-axis positive side, at a first design portion which corresponds to first design 525, and is disposed on a front surface. Light emission portion 522 is a plate-shaped portion disposed substantially parallel to an XY plane such that a thickness direction thereof is along the Z-axis direction. In light emission portion 522, the first design portion corresponding to first design 525 includes end portion 524 which is an inclined surface that is inclined with respect to a virtual plane perpendicular to the Y-axis direction. The first design portion corresponding to first design 525 on light emission portion 522 is formed by disposing a plurality of recesses each having a conical shape or a pyramidal shape with a vertex being located on the Z-axis positive side and a base being opened in a space on the Z-axis negative side.

Mask body 550 is a component having a substantially rectangular plate shape. Mask body 550 transmits, in the positive direction of the Z-axis, light emitted by second light source 175 mounted on board 119, through a light-transmissive portion which has the shape of second design 551 and is indicated by the blank portion in FIG. 5, and blocks light by a light-blocking portion which is a remaining portion of mask body 550 and indicated by the dot pattern in FIG. 5. With this configuration, when second light source 175 emits light, second design 551 is displayed on a front face of second operation unit 117 of input device 100. In other words, second light source 175 emits light to cause second design 551 to be displayed on front face 510 that serves as a display region. It should be noted that second design 551 has a shape different from a shape of first design 525.

Slider portion 560 is a component which supports front face 510, light guide body 520, and mask body 550, and is supported slidably with respect to second supporter 118 in the Z-axis direction. Slider portion 560 moves toward the Z-axis negative side as a result of front portion 510 being pressed toward the Z-axis negative side, to press switch 155 disposed at the center of board 119. Slider portion 560 is formed using, for example, an opaque resin.

(1-4. Control Circuit)

Figure 7:
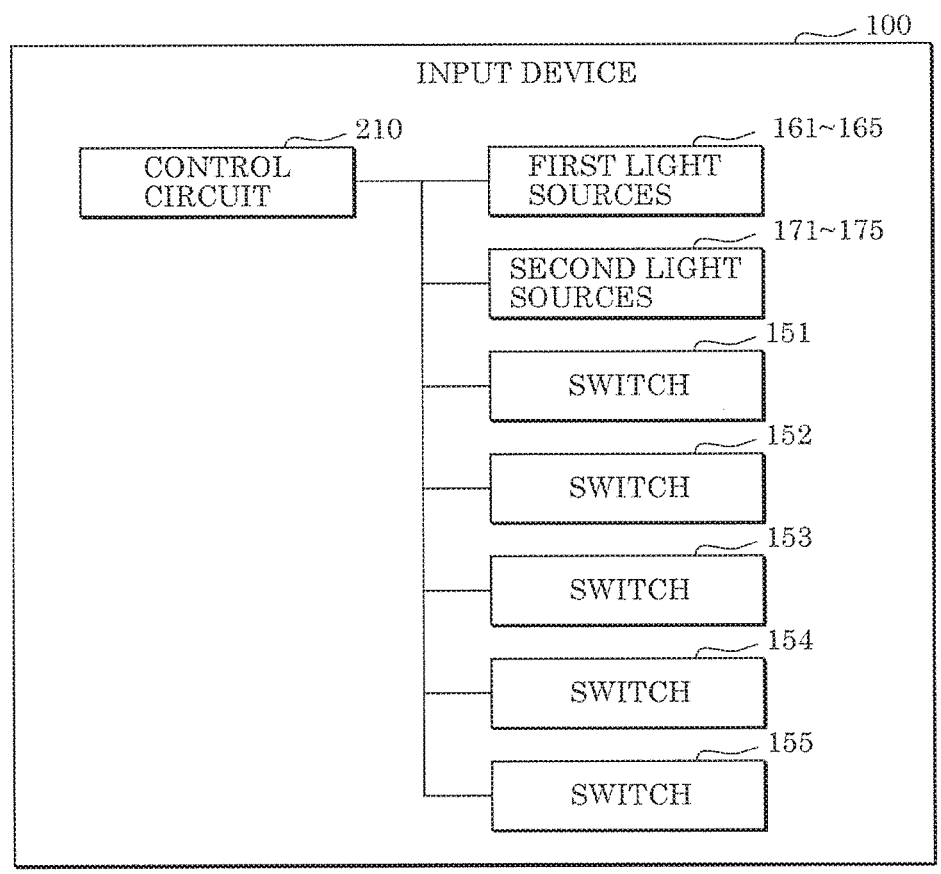
FIG. 7 is a block diagram which illustrates one example of a circuit configuration of the input device.

FIG. 7 is a block diagram which illustrates one example of a circuit configuration of input device 100.

Input device 100 includes control circuit 210, first light sources 161 to 165, second light sources 171 to 175, and switches 151 to 155. The details of first light sources 161 to 165, second light sources 171 to 175, and switches 151 to 155 have been described in the forgoing description, and thus description of the details will be omitted.

Control circuit 210, according to an input received by switch 155, (i) controls displaying of designs on front face 510 serving as a display region, by controlling the lighting state of first light sources 161 to 165 and the lighting state of second light sources 171 to 175, and outputs a control signal corresponding to the input received by switch 155, to an external device.

Here, the external device is a device different from input device 100, and is, for example, a control device for controlling a driving operation of a vehicle, an operation of an on-vehicle device, etc., or an on-vehicle device. Examples of the on-vehicle device include car navigation systems, video devices, audio equipment, air conditioning devices, communication devices, etc. According to the present embodiment, the control device as an external device operates in a first operation mode or a second operation mode. For example, the first operation mode is an operation mode for operating an information function which notifies a user of vehicle information from the on-vehicle device, and the second operation mode is an operation mode for operating an audio function which operates the audio device.

It should be noted that the first operation mode and the second operation mode are not limited to the above-described examples. The first operation mode may be a driving mode in which an inter-vehicular distance which is a distance between a user's vehicle and a vehicle in front of the user's vehicle is controlled, and the second operation mode may be a driving mode for driving at a constant speed.

Here, first design 525 is a design which indicates that an operation mode of an external device is to be switched to the first operation mode when the input is received next time by switch 155.

More specifically, when switch 155 receives an input while first light source 165 is in an on-state, control circuit 210 (i) turns off the display of first design 525 by switching the lighting state of first light source 165 from the on-state to an off-state, and (ii) outputs a first control signal for switching the operation mode to the first operation mode, to an external device. In this case, control circuit 210 switches the lighting state of second light source 175 from the off-state to the on-state, thereby turning on display of second design 551.

In this case, control circuit 210 may further switch the lighting state of first light sources 161 to 164 from the on-state to the off-state to turn off the display of first designs 141 to 144, and switch the lighting state of second light sources 171 to 174 from the off-state to the on-state to turn on the display of second designs 411 to 414.

Second designs 411 to 414 in this case are designs indicating that an input for controlling an operation of the external device in the first operation mode is to be received. More specifically, when an input is received by one of switches 151 to 154 while second designs 411 to 414 are displayed, control circuit 210 processes the input as an input for controlling an operation of the external device in the first operation mode. In the same manner, first designs 141 to 144 are designs indicating that an input for controlling an operation of the external device in the second operation mode is to be received. More specifically, when an input is received by one of switches 151 to 154 while first designs 141 to 144 are displayed, control circuit 210 processes the input as an input for controlling an operation of the external device in the second operation mode.

In addition, when switch 155 receives an input while second light source 175 is in the on-state, control circuit 210 (i) turns off the display of second design 551 by switching the lighting state of second light source 175 from the on-state to the off-state, and (ii) outputs a second control signal for switching the operation mode to the second operation mode, to the external device. In this case, control circuit 210 switches the lighting state of first light source 165 from the off-state to the on-state, thereby turning on the display of first design 525.

In this case, control circuit 210 may further switch the lighting state of first light sources 161 to 164 from the off state to the on-state to turn on the displays of first designs 141 to 144, and switch the lighting state of second light sources 171 to 174 from the on-state to the off-state to turn off the display of second designs 411 to 414. First designs 141 to 144 in this case are designs indicating that an input for controlling an operation of the external device in the second operation mode is to be received. More specifically, when an input is received by one of switches 151 to 154 while first designs 141 to 144 are displayed, control circuit 210 processes the input as an input for controlling an operation of the external device in the second operation mode.

Figure 8:
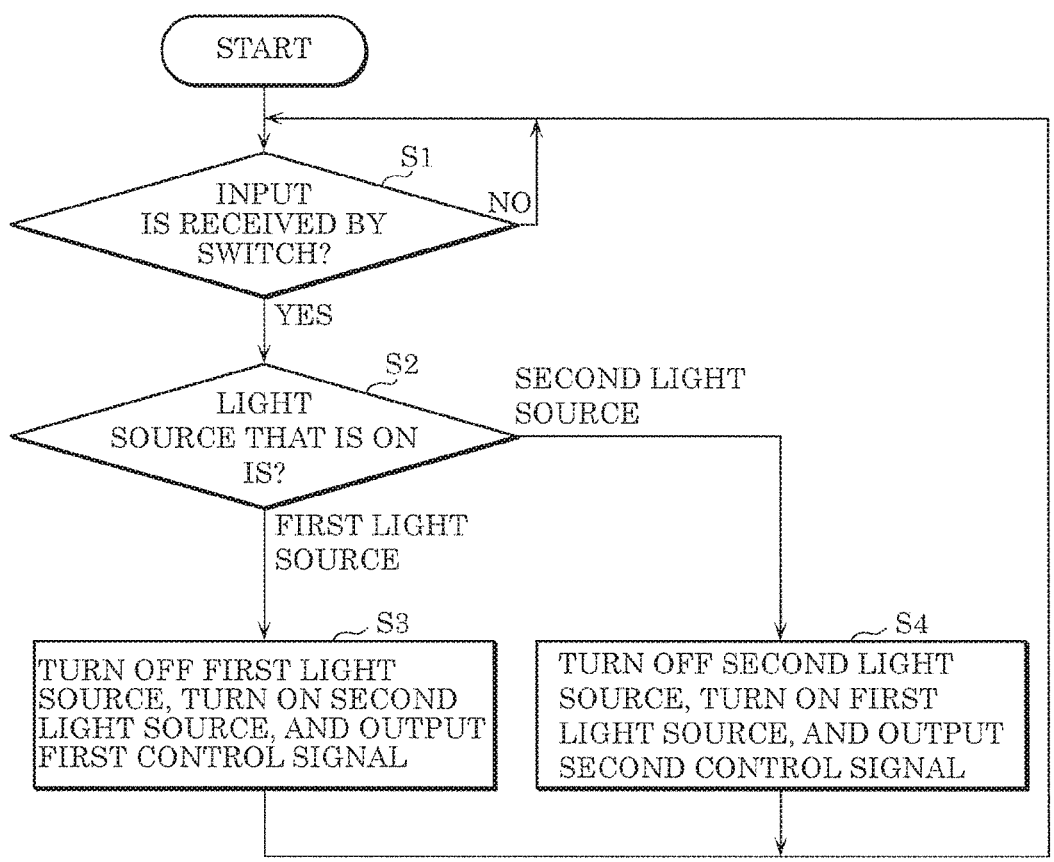
FIG. 8 is a flowchart which illustrates one example of an operation of the input device according to the embodiment.
Figure 9:
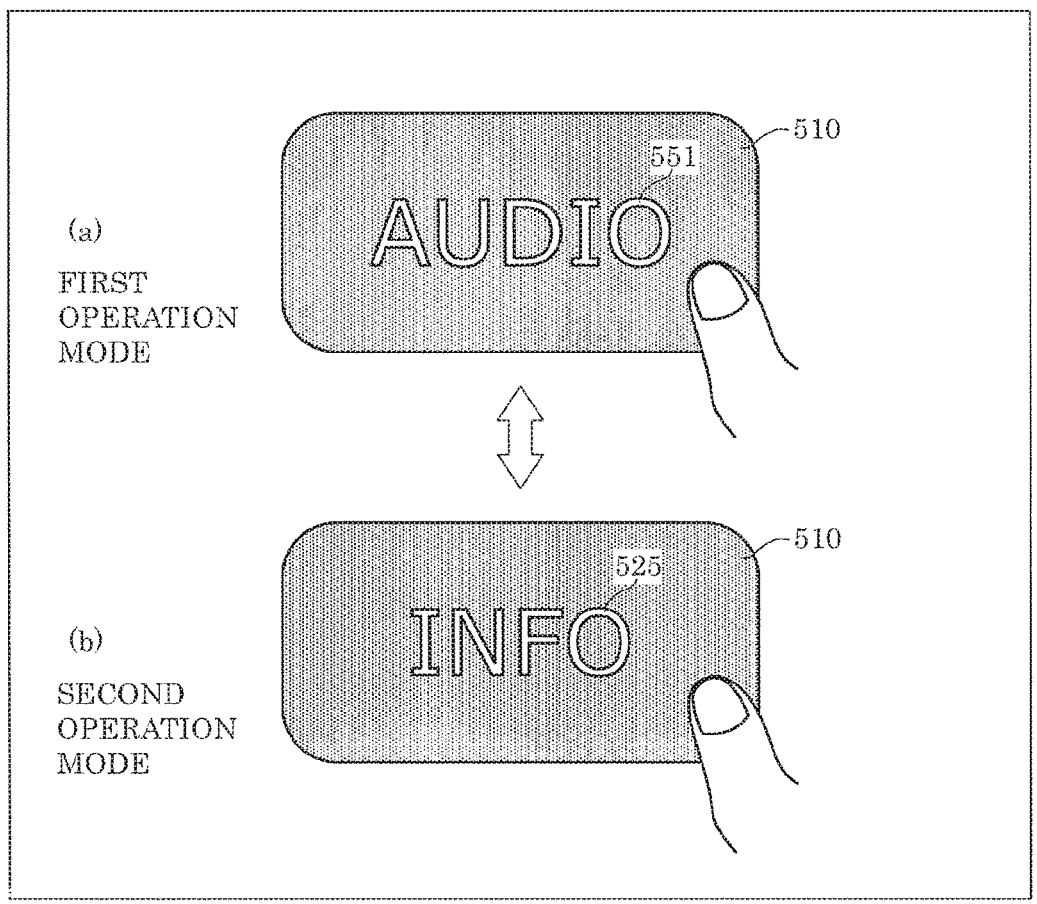
FIG. 9 is a diagram which illustrates one example of a design displayed in a display region according to an operation mode, in the input device according to the embodiment.

FIG. 8 is a flowchart which illustrates one example of an operation of input device 100 according to the embodiment. FIG. 9 is a diagram which illustrates one example of a design displayed in a display region according to an operation mode, in input device 100 according to the embodiment.

As illustrated in FIG. 8, in input device 100, control circuit 210 determines whether or not an input is received by switch 155 (S1). When control circuit 210 determines that an input is not received by switch 155 (No in S1), control circuit 210 repeats step S1.

When control circuit 210 determines that an input is received by switch 155 (Yes in S1), control circuit 210 determines whether the light source that has been on until the input is received is first light source 165 or second light source 175 (S2).

When control circuit 210 determines that first light source 165 is on (first light source in S2), control circuit 210 turns off first light source 165, turns on second light source 175, and outputs the first control signal to the external device (S3).

As illustrated in (b) in FIG. 9, the control device serving as the external device is in the second operation mode when first light source 165 is in the on-state. Accordingly, a design indicating an operation mode different from the current operation mode of the control device is displayed on front face 510. More specifically, to what operation mode the control device is to be turned next by pressing switch 155 is displayed on front face 510. Here, first design 525 indicating the first operation mode is displayed. When switch 155 receives an input in this state, control circuit 210 outputs the first control signal for switching the operation mode to the first operation mode indicated by first design 525 displayed on front face 510, to the external device. With this, the control device serving as the external device receives the first control signal, and thereby the operation mode of the control device changes to the first operation mode for operating an information function.

When control circuit 210 determines that second light source 175 is on (second light source in S2), control circuit 210 turns off second light source 175, turns on first light source 165, and outputs the second control signal to the external device (S4).

As illustrated in (a) in FIG. 9, the control device serving as the external device is in the first operation mode when second light source 175 is in the on-state. Accordingly, second design 551 indicating the second operation mode that is the next operation mode of the control device is displayed on front face 510. When switch 155 receives an input in this state, control circuit 210 outputs the second control signal for switching the operation mode to the second operation mode indicated by second design 551 displayed on front face 510, to the external device. With this, the control device serving as the external device receives the second control signal, and thereby the operation mode of the control device changes to the second operation mode for operating an audio function.

When step S3 or step S4 ends, control circuit 210 returns to step S1. Control circuit 210 repeatedly executes the operation of FIG. 8 when the power source of control circuit 210 is on, and ends the operation when the power source of control circuit 210 is turned off.

(1-5. Advantageous Effects, etc.)

Input device 100 according to the present embodiment includes first light source 165, second light source 175, switch 155, and control circuit 210. First light source 165 emits light to cause first design 525 to be displayed on front face 510 serving as a display region. Second light source 175 emits light to cause second design 551 that is different from first design 525 to be displayed on front face 510. Switch 155 receives an input from a user. Control circuit 210, according to an input received by switch 155, (i) controls displaying of designs on front face 510, by controlling the lighting state of first light source 165 and the lighting state of second light source 175, and (ii) outputs a control signal corresponding to the input received by switch 155, to an external device.

With this, control circuit 210 controls displaying of designs on front face 510, by controlling the lighting state of first light source 165 and the lighting state of second light source 175 according to an input received by switch 155. In addition, control circuit 210 outputs a control signal corresponding to the input, to the external device. Accordingly, a user can perform an input on a desired switch, and cause the external device to carry out an intended operation. It is thus possible to reduce false operations by the user.

In addition, with input device 100 according to the present embodiment, the external device is a device which operates in the first operation mode or the second operation mode. First design 525 is a design which indicates that an operation mode of the external device is to be switched to the first operation mode when the input is received next time by switch 155. When switch 155 receives an input while first light source 165 is in an on-state, control circuit 210 (i) turns off the display of first design 525 by switching the lighting state of first light source 165 from the on-state to an off-state, and (ii) outputs a first control signal for switching the operation mode to the first operation mode, to the external device.

With this, input device 100 displays a design which indicates an operation mode to be switched to when switch 135 receives an input next time. Accordingly, it is possible for a user to know that the operation mode will be switched, when the user performs an input on switch 155 next tune, to an operation mode indicated by the design currently displayed. Accordingly, the user can perform an input on a desired switch, and easily cause the external device to carry out an intended operation.

(1-6. Variation)

(1-6-1. Variation 1)

Next, Variation 1 will be described.

Although the foregoing embodiment describes the case where a design which indicates an operation mode of an external device to be switched to next time when switch 155 receives an input next time is displayed on front face 510, the present disclosure is not limited to this example. In Variation 1, a design which indicates a current operation mode of the external device may be displayed on front face 510. Input device 100 according to Variation 1 has a configuration equivalent to the configuration of input device 100 according to the embodiment. Variation 1 differs from the foregoing embodiment in what first design 525 and second design 551 respectively mean, and in an operation of control circuit 210 of input device 100.

In Variation 1, first design 525 indicates that a current operation mode of an external device is the first operation mode. Second design 551 indicates that a current operation mode of the external device is the second operation mode.

When switch 155 receives an input while first light source 165 is in an on-state, control circuit 210 (i) switches a design displayed on front face 510 serving as a display region from first design 525 to second design 551, by switching the lighting state of first light source 165 from the on-state to an off-state and switches the lighting state of second light source 175 from the off-state to the on-state, and (ii) outputs a second control signal for switching the operation mode to the second operation mode, to the external device. In this case, control circuit 210 may further switch the lighting state of first light sources 161 to 164 from the on-state to the off-state and switch the lighting state of second light sources 171 to 174 from the off-state to the on-state, thereby switching designs displayed on four portions 125 to 128 serving as display regions from first designs 141 to 144 to second designs 411 to 414. Second designs 411 to 414 in this case are designs indicating that an input for controlling an operation of the external device in the second operation mode is to be received by corresponding switches 151 to 154. More specifically, when an input is received by one of switches 151 to 154 while second designs 411 to 414 are displayed, control circuit 210 processes the input as an input for controlling an operation of the external device in the second operation mode.

In addition, when switch 155 receives an input while second light source 175 is in an on-state, control circuit 210 (i) switches a design displayed on front face 510 serving as a display region from second design 551 to first design 525, by switching the lighting state of second light source 175 from the on-state to an off-state and switches the lighting state of first light source 165 from the off-state to the on-state, and (ii) outputs a first control signal for switching the operation mode to the first operation mode, to the external device. In this case, control circuit 210 may further switch the lighting state of second light sources 171 to 174 from the on-state to the off-state and switch the lighting state of first light sources 161 to 164 from the off-state to the on-state, thereby switching designs displayed on four portions 125 to 128 serving as display regions from second designs 411 to 414 to first designs 141 to 144. First designs 141 to 144 in this case are designs indicating that an input for controlling an operation of the external device in the first operation mode is to be received by corresponding switches 151 to 154. More specifically, when an input is received by one of switches 151 to 154 while first designs 141 to 144 are displayed, control circuit 210 processes the input as an input for controlling an operation of the external device in the first operation mode.

Figure 10:
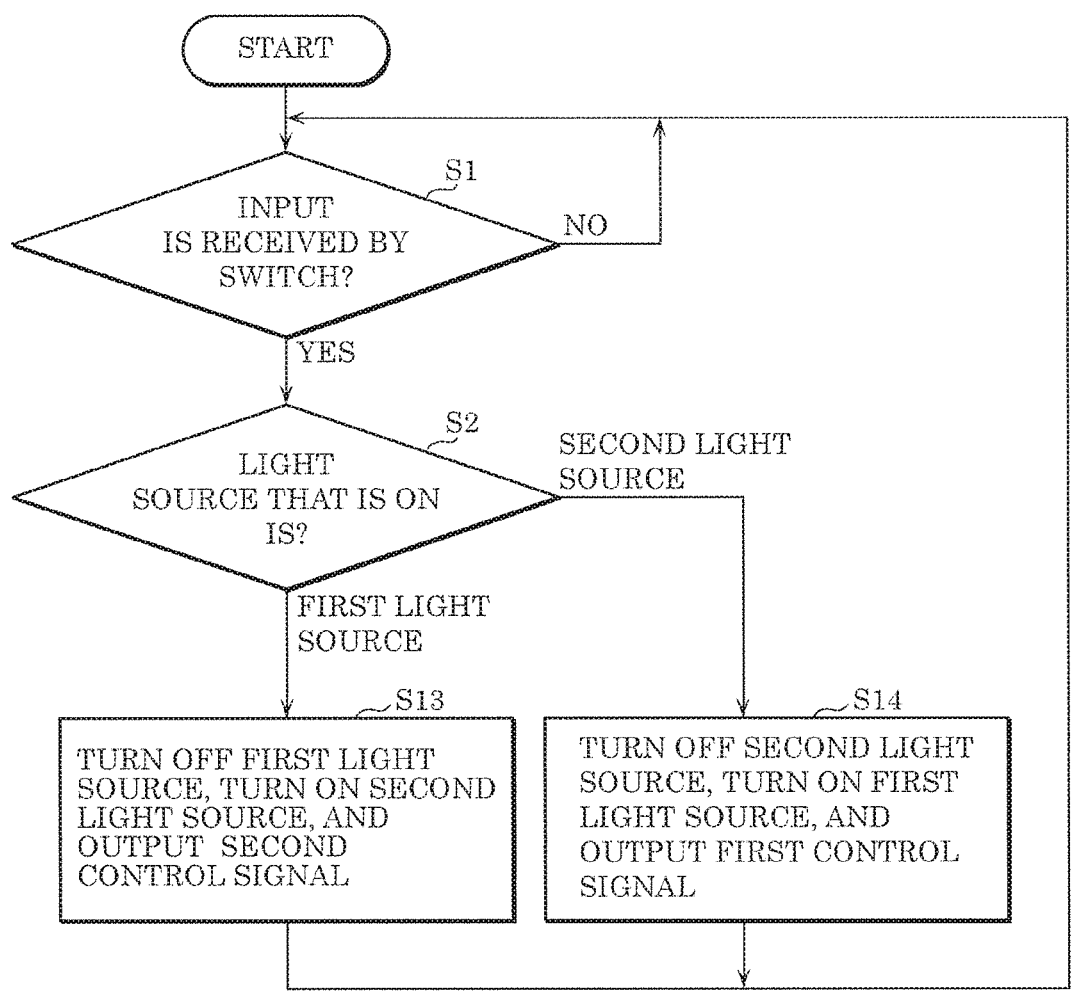
FIG. 10 is a flowchart which illustrates one example of an operation of an input device according to Variation 1.
Figure 11:
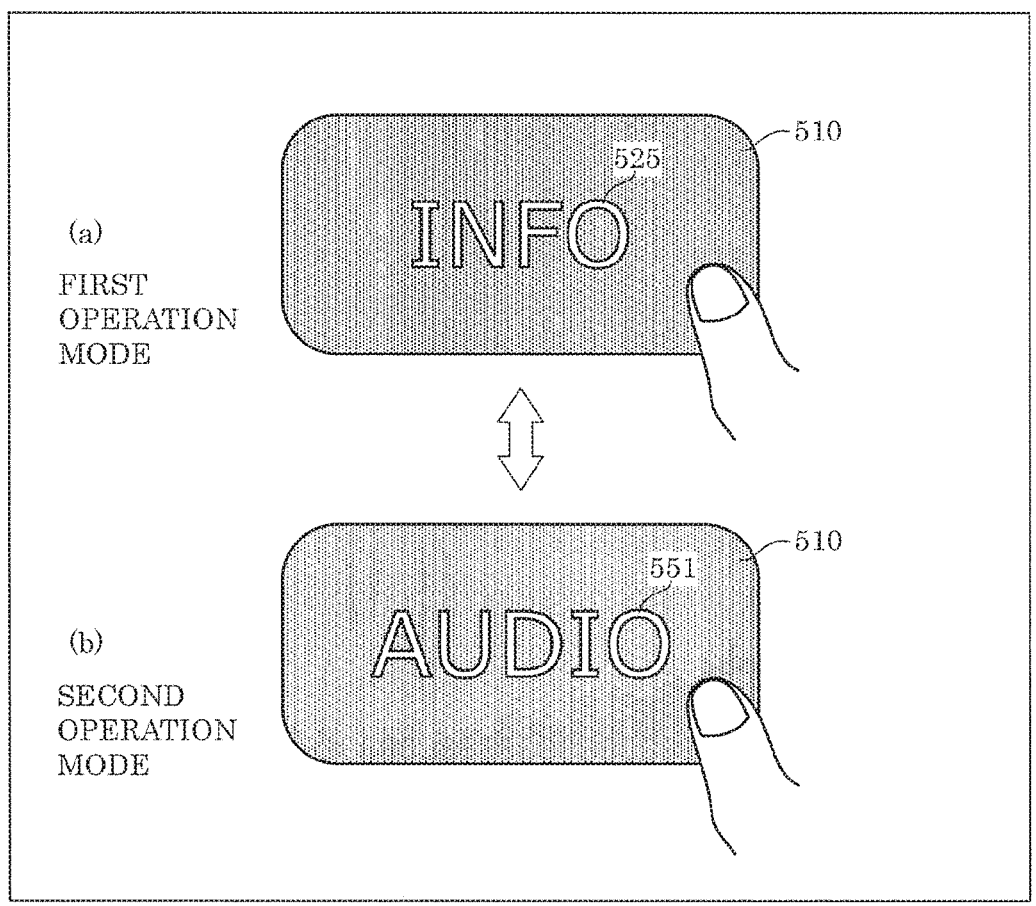
FIG. 11 is a diagram which illustrates one example of a design displayed in a display region according to an operation mode, in the input device according to Variation 1.

FIG. 10 is a flowchart which illustrates one example of an operation of input device 100 according to Variation 1. FIG. 11 is a diagram which illustrates one example of a design displayed in a display region according to an operation mode, in input device 100 according to Variation 1.

In the flowchart illustrated in FIG. 10, step S1 and step S2 are equivalent to step S1 and step S2 in the flowchart illustrated in FIG. 8, and thus step S13 and step S14 subsequent to step S2 will be described.

When control circuit 210 determines that first light source 165 is on (first light source in S2), control circuit 210 turns off first light source 165, turns on second light source 175, and outputs the second control signal to the external device (S13).

As illustrated in (a) in FIG. 11, the control device serving as the external device is in the first operation mode when first light source 165 is in the on-state. Accordingly, first design 525 indicating the first operation mode that is the current operation mode of the control device is displayed on front face 510. When switch 155 receives an input in this state, control circuit 210 outputs the second control signal for switching the operation mode to the second operation mode which is different from the first operation mode as indicated by first design 525 displayed on front face 510, to the external device. With this, the control device serving as the external device receives the second control signal, and thereby the operation mode of the control device changes to the second operation mode for operating an audio function.

When control circuit 210 determines in step S2 that second light source 175 is on (second light source in S2), control circuit 210 turns off second light source 175, turns on first light source 165, and outputs the first control signal to the external device (S14).

As illustrated in (b) in FIG. 11, the control device serving as the external device is in the second operation mode when second light source 175 is in the on-state. Accordingly, second design 551 indicating the second operation mode that is the current operation mode of the control device is displayed on front face 510. When switch 155 receives an input in this state, control circuit 210 outputs the first control signal for switching the operation mode to the first operation mode which is different from the second operation mode indicated by second design 551 displayed on front face 510, to the external device. With this, the control device serving as the external device receives the first control signal, and thereby the operation mode of the control device changes to the first operation mode for operating an information function.

When step S13 or step S14 ends, control circuit 210 returns to step S1. Control circuit 210 repeatedly executes the operation of FIG. 10 when the power source of control circuit 210 is on, and ends the operation when the power source of control circuit 210 is turned off.

With input device 100 according to the present variation, the external device is a device which operates in the first operation mode or the second operation mode. First design 525 indicates that a current operation mode of the external device is the first operation mode. Second design 551 indicates that a current operation mode of the external device is the second operation mode. When switch 155 receives an input while first light source 165 is in an on-state, control circuit 210 (i) switches a design displayed on front face 510 serving as a display region from first design 525 to second design 551, by switching the lighting state of first light source 165 from the on-state to an off-state and switches the lighting state of second light source 175 from the off-state to the on-state, and (ii) outputs a second control signal for switching the operation mode to the second operation mode, to the external device.

With this, input device 100 displays a design indicating a current operation mode, of two operation modes of the external device, and does not display an operation mode different from the current operation mode. Accordingly, it is possible for a user to know that the operation mode will be switched, when the user performs next time an input on switch 155, to the other operation mode different from the operation mode currently displayed. Accordingly, a user can perform input on a desired switch, and cause the external device to carry out an intended operation.

(1-6-2. Variation 2)

Next, Variation 2 will be described.

Although the foregoing embodiment and Variation 1 of the embodiment describe the case where one of first design 525 and second design 551 is displayed on front face 510, the present discloser is not limited to this example. In Variation 2, both first design 525a and second design 551a may be displayed on front face 510 (see FIG. 13 described later). Input device 100 of Variation 2 has a configuration which differs from the configuration described in the embodiment and Variation 1 of the embodiment in that first design 525a and second design 551a are disposed at non-overlapping positions, and in an operation of control circuit 210 of input device 100.

In Variation 2, first design 525a indicates that a current operation mode of an external device is the first operation mode. Second design 551a indicates that a current operation mode of the external device is the second operation mode.

When switch 155 receives an input while first design 525a and second design 551a are displayed with emphasis on first design 525a, control circuit 210 switches the design displayed with emphasis from first design 525a to second design 551a, and outputs a second control signal for switching the operation mode to the second operation mode, to an external device. More specifically, control circuit 210 switches the design displayed with emphasis on front face 510 serving as a display region from first design 525a to second design 551a, by switching the lighting state from a first state to a second state. The first state is a state in which first light source 165 is caused to emit light having a color (for example, red, yellow, blue, green, etc.) or luminance with greater emphasis than a color or luminance of light emitted by second light source 175. The second state is a state in which second light source 175 is caused to emit light having a color (for example, red, yellow, blue, green, etc.) or luminance with greater emphasis than a color or luminance of light emitted by first light source 165. In this case, control circuit 210 may further switch designs displayed on four portions 125 to 128 serving as the display regions from first designs 141 to 144 to second designs 411 to 414, by switching the lighting state of first light sources 161 to 164 from the on-state to the off-state and switching the lighting state of second light sources 171 to 174 from the off-state to the on-state. Second designs 411 to 414 in this case are designs indicating that an input for controlling operation of the external device in the second operation mode is to be received by corresponding switches 151 to 154. More specifically, when an input is received by one of switches 151 to 154 while second designs 411 to 414 are displayed, control circuit 210 processes the input as an input for controlling an operation of the external device in the second operation mode.

In addition, when switch 155 receives an input while second design 551a is displayed with greater emphasis than first design 525a, control circuit 210 switches the design displayed with greater emphasis from second design 551a to first design 525a, and outputs a first control signal for switching the operation mode to the first operation mode, to the external device. More specifically, control circuit 210 switches the design displayed with emphasis on front face 510 serving as the display region from second design 551a to first design 525a, by switching the lighting state of first light source 165 and the lighting state of second light source from the second state to the first state. The second lighting state is a state in which second light source 175 is caused to emit light having a color (for example, red, yellow, blue, green, etc.) or luminance with greater emphasis than a color or luminance of light emitted by first light source 165. The first state is a state in which first light source 165 is caused to emit light having a color (for example, red, yellow, blue, green, etc.) or luminance with greater emphasis than a color or luminance of light emitted by second light source 175, thereby switching in this case, control circuit 210 may further switch designs displayed on four portions 125 to 128 serving as the display regions from second designs 411 to 414 to first designs 141 to 144, by switching the lighting state of second light sources 171 to 174 from the on-state to the off-state and switching the lighting state of first light sources 161 to 164 from the off-state to the on-state. First designs 141 to 144 in this case are designs indicating that an input for controlling an operation of the external device in the first operation mode is to be received by corresponding switches 151 to 154. More specifically, when an input is received by one of switches 151 to 154 while first designs 141 to 144 are displayed, control circuit 210 processes the input as an input for controlling an operation of the external device in the first operation mode.

Figure 12:
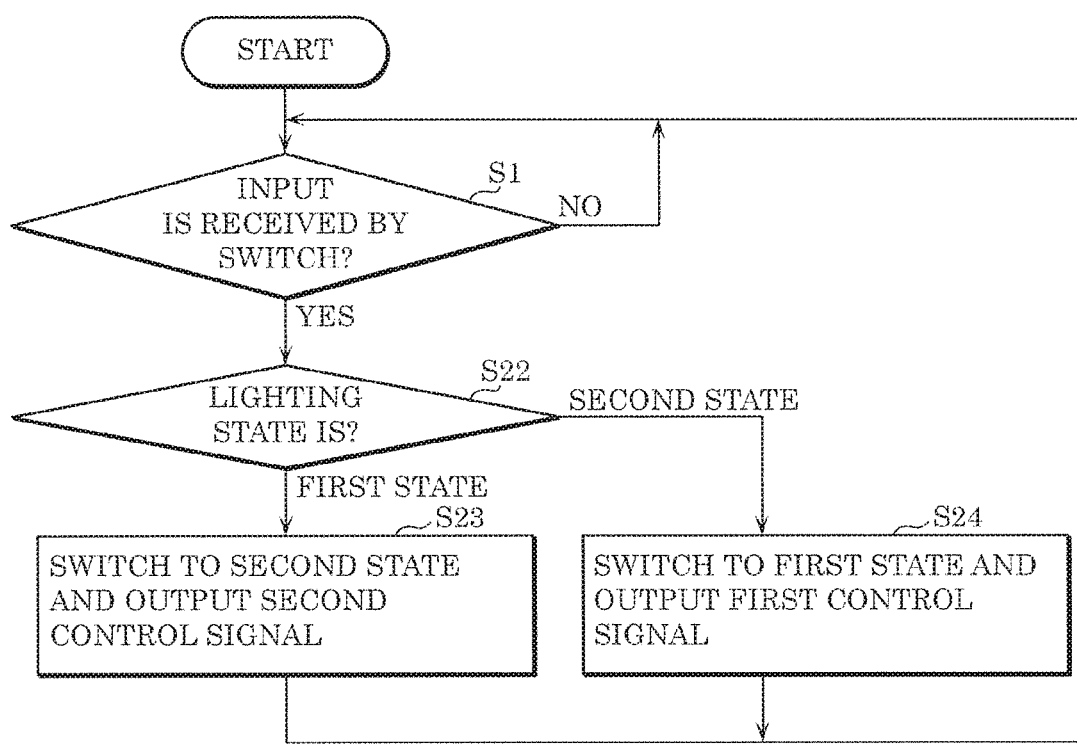
FIG. 12 is a flowchart which illustrates one example of an operation of an input device according to Variation 2.
Figure 13:
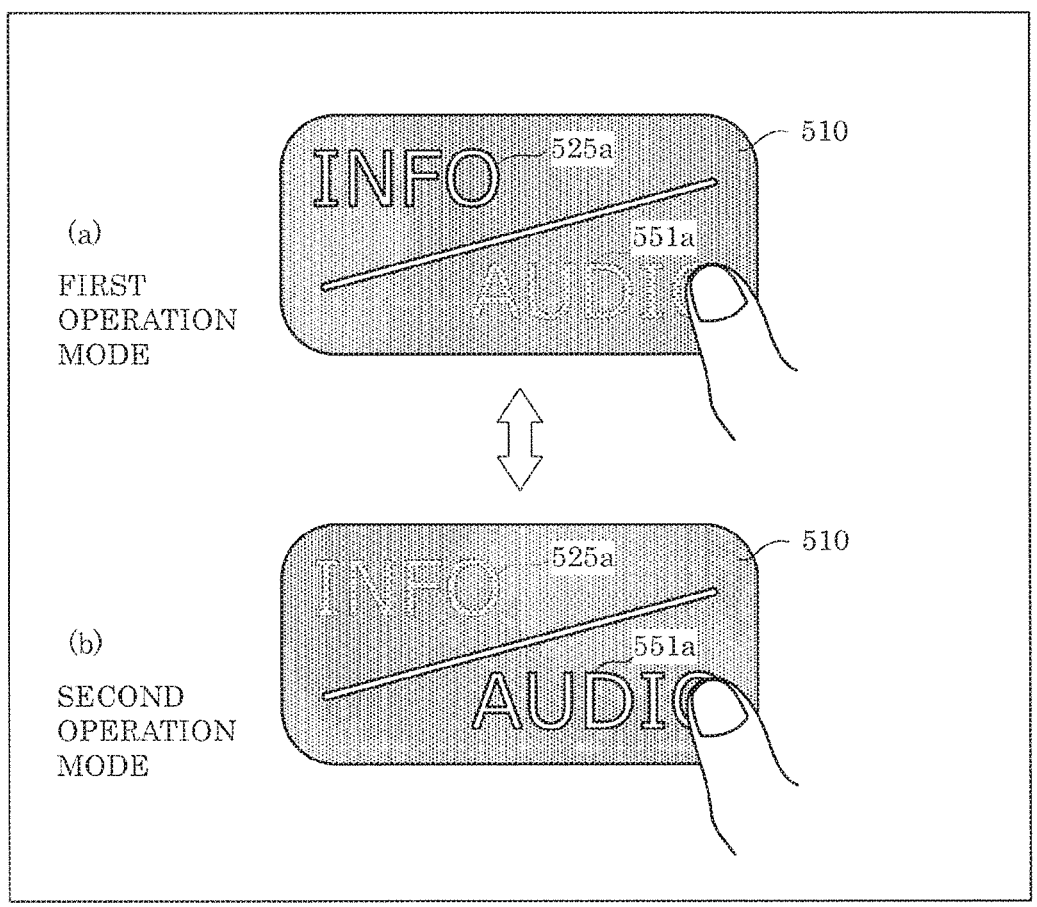
FIG. 13 is a diagram which illustrates one example of a design displayed in a display region according to an operation mode, in the input device according to Variation 2.

FIG. 12 is a flowchart which illustrates one example of an operation of input device 100 according to Variation 2. FIG. 13 is a diagram which illustrates one example of a design displayed in the display region according to an operation mode, in input device 100 according to Variation 2.

In the flowchart illustrated in FIG. 12, step S1 is equivalent to step S1 in the flowchart illustrated in FIG. 8, and thus step S22 to step S24 subsequent to step S1 will be described.

When control circuit 210 determines in step S1 that an input is received by switch 155 (Yes in S1), control circuit 210 determines the lighting state of first light source 165 and the lighting state of second light source 175 before the input is received (S22).

When control circuit 210 determines the lighting state of first light source 165 and the lighting state of second light source 175 as the first state in which first light source 165 is caused to emit light having a color or luminance with greater emphasis than a color or luminance of second light source 175 (the first state in S22), control circuit 210 switches the lighting state of first light source 165 and the lighting state of second light source 175 to the second state in which second light source 175 is caused to emit light having a color or luminance with greater emphasis than a color or luminance of first light source 165, and outputs the second control signal to the external device (S23).

As illustrated in (a) in FIG. 13, the control device serving as the external device is in the first operation mode when first light source 165 and second light source 175 are placed in the first state. Accordingly, first design 525a indicating the first operation mode that is the current operation mode of the control device is displayed on front face 510 with greater emphasis than second design 551a. When switch 155 receives an input in this state, control circuit 210 outputs the second control signal for switching the operation mode to the second operation mode which is different from the first operation mode indicated by first design 525a displayed with emphasis on front face 510, to the external device. With this, the control device serving as the external device receives the second control signal, and thereby the operation mode of the control device changes to the second operation mode for operating the audio function.

When control circuit 210 determines the lighting state of first light source 165 and the lighting state of second light source 175 as the second state in which second light source 175 is caused to emit light having a color or luminance with greater emphasis than a color or luminance of light emitted by first light source 165 (the second state in S22), control circuit 210 switches the lighting state of first light source 165 and the lighting state of second light source 175 to the first state in which first light source 165 is caused to emit light having a color or luminance with greater emphasis than a color or luminance of light emitted by second light source 175, and outputs the first control signal to the external device (S24).

As illustrated in (b) in FIG. 13, the control device serving as the external device is in the second operation mode when first light source 165 and second light source 175 are placed in the second state. Accordingly, second design 551a indicating the second operation mode that is the current operation mode of the control device is displayed on front face 510 with greater emphasis than first design 525a. When switch 155 receives an input in this state, control circuit 210 outputs the first control signal for switching the operation mode to the first operation mode which is different from the second operation mode indicated by second design 551a displayed with emphasis on front face 510, to the external device. With this, the control device serving as the external device receives the first control signal, and thereby the operation mode of the control device changes to the first operation mode for operating an information function.

When step S23 or step S24 ends, control circuit 210 returns to step S1. Control circuit 210 repeatedly executes the operation of FIG. 12 when the power source of control circuit 210 is on, and ends the operation when the power source of control circuit 210 is turned off.

With input device 100 according to the present variation, the external device is a device which operates in the first operation mode or the second operation mode. First design 525a indicates that a current operation mode of the external device is the first operation mode. Second design 551a indicates that a current operation mode of the external device is the second operation mode. When switch 155 receives an input while first design 525a is displayed with greater emphasis than second design 551a, control circuit 210 (i) switches the design displayed with greater emphasis from first design 525a to second design 551a, and (ii) outputs the second control signal for switching the operation mode to the second operation mode, to the external device.

In this manner, input device 100 displays, out of two operation modes of the external device, the design indicating a current operation mode with greater emphasis than the design indicating an operation mode different from the current operation mode. Accordingly, a user can easily know both the current operation mode and the operation mode to be switched to when switch 155 receives an input next time. Accordingly, it is possible for the user to perform an input on a desired switch, and to easily cause the external device to carry out an intended operation.

In addition, with input device 100 according to the present variation, control circuit 210 switches the design displayed with greater emphasis on front face 510 serving as the display region from first design 525a to second design 551a, by switching the lighting state of first light source 165 and the lighting state of second light source 175 from the first state to the second state. The first state is a state in which first light source 165 is caused to emit light having a color or luminance with greater emphasis than a color or luminance of light emitted by second light source 175. The second state is a state in which second light source 175 is caused to emit light having a color or luminance with greater emphasis than a color or luminance of light emitted by first light source 165.

Accordingly, it is possible for a user to easily distinguish between a design displayed with emphasis and a design displayed without emphasis.

(1-6-3. Variation 3)

Next, Variation 3 will be described.

Although control circuit 210 of input device 100 switches the operation mode whenever switch 155 receives an input according to the foregoing embodiment and Variations 1 and 2 of the foregoing embodiment, the present disclosure is not limited to this example. In Variation 3, the operation mode may be switched when switch 155 is continuously pressed for a predetermined period or longer. Input device 100 according to Variation 3 is different from input 100 according to the embodiment and Variations 1 and 2 of the embodiment in a shape of first design 525b displayed when first light source 165 emits light, a shape of second design 551b displayed when second light source 175 emits light, and an operation of control circuit 210 of input device 100.

In Variation 3, first design 525b indicates that a first control in the first operation mode is to be executed by an external device. Second design 551b indicates that a second control in the second operation mode is to be executed by the external device.

When switch 155 is continuously pressed for a predetermined period or longer while first light source 165 is in an on-state, control circuit 210 (i) switches the lighting state of first light source 165 from the on-state to an off-state and switches the lighting state of second light source 175 from the off-state to the on-state, and (ii) outputs a second control signal for switching the operation mode to the second operation mode, to the external device. In addition, when switch 155 is pressed for less than a predetermined period while first light source 165 is in the on-state, control circuit 210 outputs a control signal for causing the first control to be executed, to the external device.

In addition, when switch 155 is continuously pressed for a predetermined period or longer while first light source 165 is in the on-state, control circuit 210 may further switch the designs displayed on four portions 125 to 128 serving as display regions from first designs 141 to 144 to second designs 411 to 414, by switching the lighting state of first light sources 161 to 164 from the on-state to the off-state and switching the lighting state of second light sources 171 to 174 from the off-state to the on-state. Second designs 411 to 414 in this case are designs indicating that an input for controlling an operation of the external device in the second operation mode is to be received by corresponding switches 151 to 154. More specifically, when an input is received by one of switches 151 to 154 while second designs 411 to 414 are displayed, control circuit 210 processes the input as an input for controlling an operation of the external device in the second operation mode.

In addition, when switch 155 is continuously pressed for a predetermined period or longer while second light source 175 is in the on-state, control circuit 210 (i) switches the lighting state of first light source 165 from the off-state to the on-state and switches the lighting state of second light source 175 from the on-state to the off-state, and (ii) outputs a first control signal for switching the operation mode to the first operation mode, to the external device. In addition, when switch 155 is pressed for less than a predetermined period while second light source 175 is in the on-state, control circuit 210 outputs a control signal for causing the second control to be executed, to the external device.

In addition, when switch 155 is continuously pressed for a predetermined period or longer while second light source 175 is in the on-state, control circuit 210 may further switch the designs displayed on four portions 125 to 128 serving as display regions tram second designs 411 to 414 to first designs 141 to 144, by switching the lighting state of second light sources 171 to 174 from the on-state to the off-state and switching the lighting state of first light sources 161 to 164 from the off-state to the on-state. First designs 141 to 144 in this case are designs indicating that an input for controlling an operation of the external device in the first operation mode is to be received by corresponding switches 151 to 154. More specifically, when an input is received by one of switches 151 to 154 while first designs 141 to 144 are displayed, control circuit 210 processes the input as an input for controlling an operation of the external device in the first operation mode.

Figure 14:
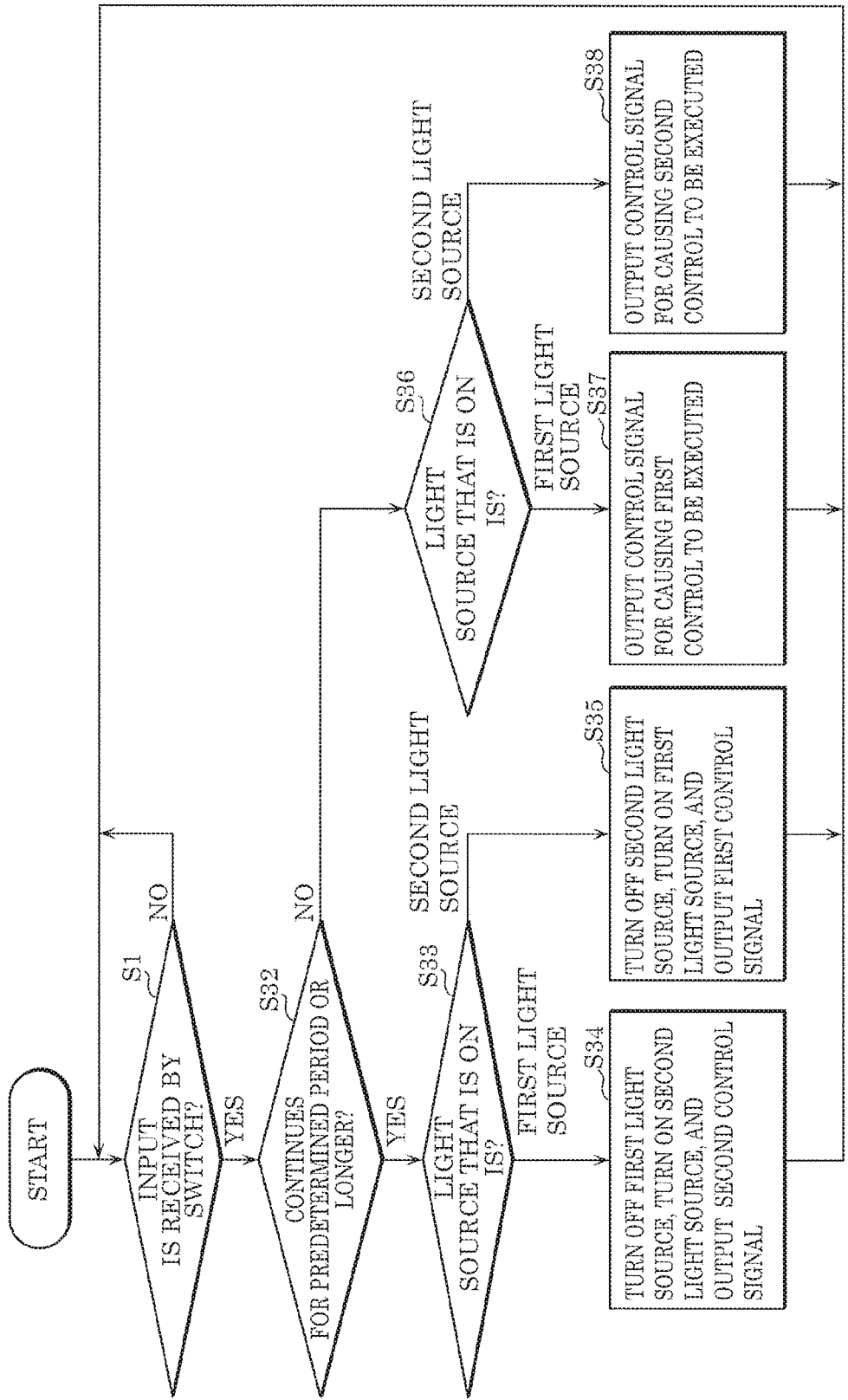
FIG. 14 is a flowchart which illustrates one example of an operation of an input device according to Variation 3.
Figure 15:
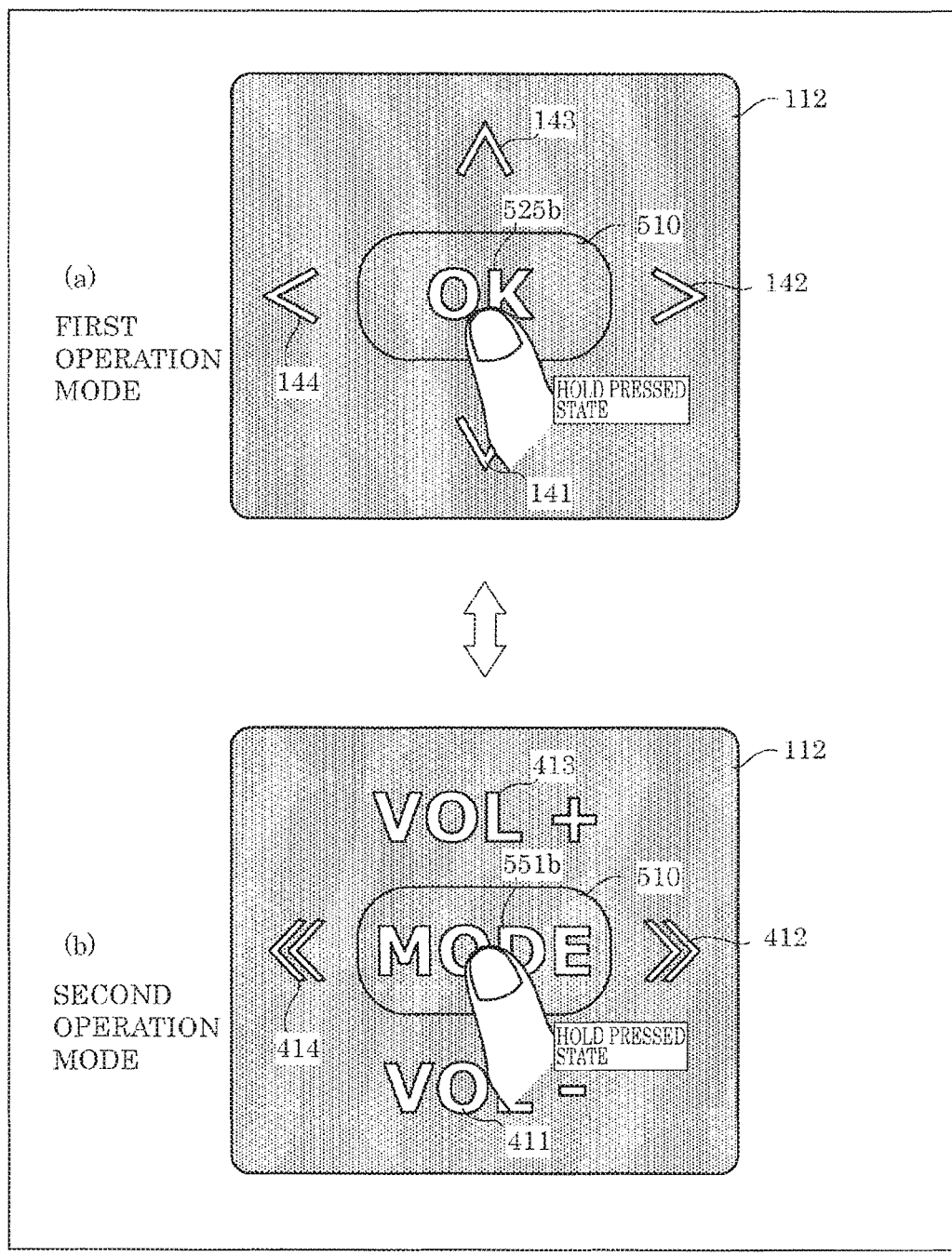
FIG. 15 is a diagram which illustrates one example of a design displayed in a display region according to an operation mode, in the input device according to Variation 3.

FIG. 14 is a flowchart which illustrates one example of an operation of input device 100 according to Variation 3. FIG. 15 is a diagram which illustrates one example of a design displayed in the display region according to an operation mode, in input device 100 according to Variation 3.

In the flowchart illustrated in FIG. 14, step S1 is equivalent to step S1 in the flowchart, illustrated in FIG. 8, and thus step S32 to step S38 subsequent to step S1 will be described.

When control circuit 210 determines in step S1 that an input is received by switch 155 (Yes in S1), control circuit 210 determines whether or not the input is continued for a predetermined period or longer (S32).

When control circuit 210 determines that the input is continued for the predetermined period or longer (Yes in S32), control circuit 210 determines whether the light source that has been on until the input is received is first light source 165 or second light source 175 (S33).

When control circuit 210 determines that first light source 165 is on (first light source in S33), control circuit 210 turns off first light source 165, turns on second light source 175, and outputs the second control signal to the external device (S34).

As illustrated in (a) in FIG. 15, the control device as the external device is in the first operation mode when first light source 165 is in the on-state. Accordingly, first design 525b indicating that a first control in the first operation mode that is the current operation mode of the control device is to be executed by the external device is displayed on front face 510. When switch 155 receives, in this state, an input by being continuously pressed for the predetermined period or longer, namely, an input by holding pressed state, control circuit 210 outputs a second control signal for switching the operation mode to the second operation mode which is different from the first operation mode, to the external device. With this, the control device serving as the external device receives the second control signal, and thereby the operation mode of the control device changes to the second operation mode for operating the audio function.

When control circuit 210 determines that second light source 175 is on (second light source in S33), control circuit 210 turns off second light source 175, turns on first light source 165, and outputs the first control signal to the external device (S35).

As illustrated in (b) in FIG. 15, the control device as the external device is in the second operation mode when second light source 175 is in the on-state. Accordingly, second design 551b indicating that a second control in the second operation mode that is the current operation mode of the control device is to be executed by the external device is displayed on front face 510. When switch 155 receives, in this state, an input by being continuously pressed for the predetermined period or longer, namely, an input by holding pressed state, control circuit 210 outputs a first control signal for switching the operation mode to the first operation mode, to the external device. With this, the control device serving as the external device receives the first control signal, and thereby the operation mode of the control device changes to the first operation mode for operating an information function.

When control circuit 210 determines that the input is continued for less than the predetermined period (No in S32), control circuit 210 determines whether the light source that has been on until the input is received is first light source 165 or second light source 175 (S36).

When control circuit 210 determines that first light source 165 is on (first light source in S36), control circuit 210 outputs a control signal for causing the external device to execute the first control, to the external device (S37).

When control circuit 210 determines that second light source 175 is on (second light source in S36), control circuit 210 outputs a control signal for causing the external device to execute the second control, to the external device (S38).

When step S34, step S35, step S37, or step S38 ends, control circuit 210 returns to step S1. Control circuit 210 repeatedly executes the operation of FIG. 14 when the power source of control circuit 210 is on, and ends the operation when the power source of control circuit 210 is turned off.

In this manner, when an input is continued for less than a predetermined period, control circuit 210 receives the input as an input for executing a control in an operation mode of the external device as with the input to switches 151 to 154, and outputs a control signal for causing the external device to execute the control, to the external device. For example, in the case illustrated in (a) in FIG. 15, when an input is continued for less than a predetermined period, control circuit 210 receives the input as an input for executing a control of "OK" (i.e., determined) indicated by first design 525b. In addition, in the case illustrated in (b) in FIG. 15, when an input is continued for less than a predetermined period, control circuit 210 receives the input as an input for executing a control of "MODE" audio mode selection) indicated by second design 551b.

With input device 100 according to the present variation, the external device is a device which operates in the first operation mode or the second operation mode. First design 525b indicates that a first control in the first operation mode is to be executed by the external device. Second design 551b indicates that a second control in the second operation mode is to be executed by the external device. In the case where first light source 165 is in an on-state, (i) when switch 155 is continuously pressed for a predetermined period or longer, (i-i) control circuit 210 switches a design displayed on front face 510 serving as a display region from first design 525b to second design 551b, by switching the lighting state of first light source 165 from an off-state to an on-state and switching the lighting state of second light source 175 from the off-state to the on-state, and (i-ii) outputs a second control signal for switching the operation mode to the second operation mode, and (ii) outputs a control signal for executing the first control to the external device, when switch 155 is continuously pressed for less than the predetermined period.

In this manner, input device 100 switches between switching an operation mode of the external device and causing the external device to execute the first control, depending on whether switch 155 is continuously pressed for a predetermined period or longer or switch 155 is continuously pressed for less than the predetermined period. Accordingly, it is not necessary to separately include a switch for switching between the operation modes, making it possible to reduce the number of switches.

It should be noted that, although the present variation describes the case where switch 155 is a switch that receives an input from a user, by being pressed by the user, switch 155 may be a touch switch that receives a touch input from a user, by being touched by the user. Such a case can be explained by reading the pressing as touching in the present variation.

(1-6-4. Variation 4)

Next, Variation 4 will be described.

Although the foregoing embodiment describes the case where a control signal for switching the operation mode of the external device is output to the external device when switch 155 receives an input, the present disclosure is not limited to this case. A control signal for switching an operational state of the external device may be output to the external device.

Figure 16:
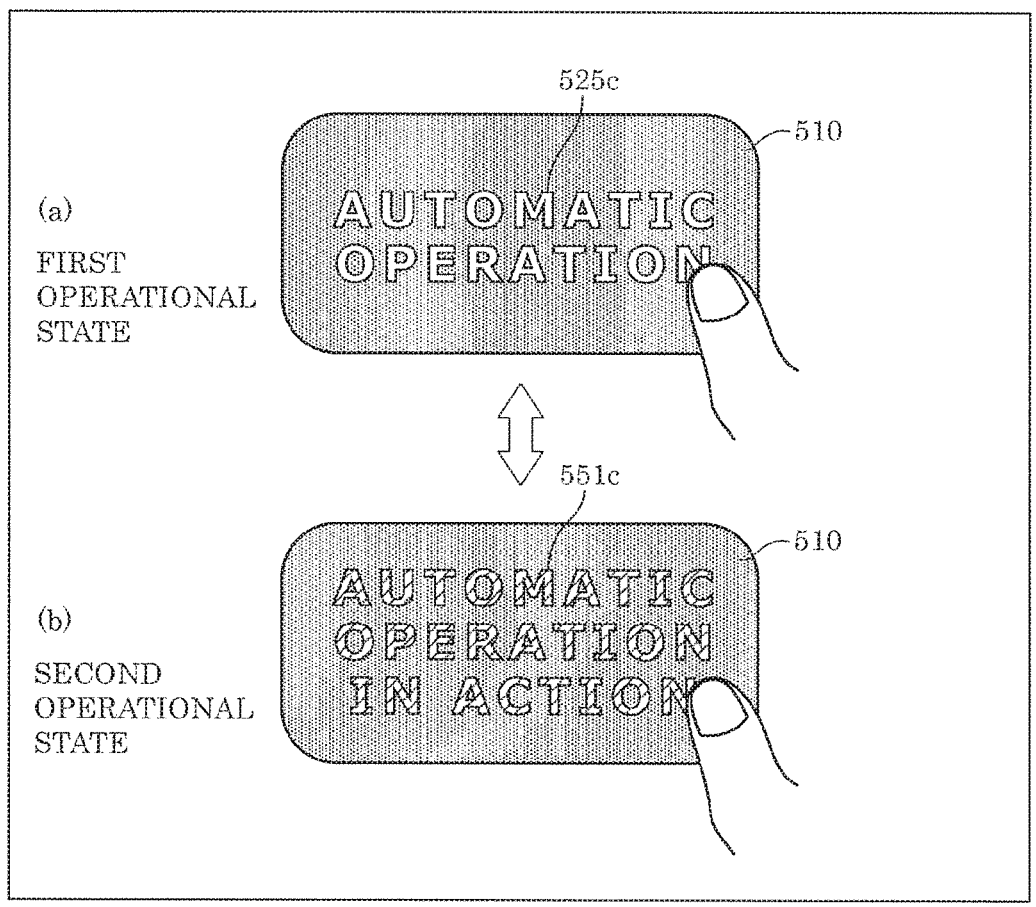
FIG. 16 is a diagram which illustrates one example of a design displayed in a display region according to an operation mode, in an input device according to Variation 4.

FIG. 16 is a diagram which illustrates one example of a design displayed in the display region according to an operational state, in input device 100 according to Variation 4.

In Variation 4, first design 525c indicates that a current operational state of an external device is the first operational state. Second design 551c indicates that the current operational state of the external device is the second operational state. Second design 551c may be displayed in a color different from a color of first design 525c. In this case, the color of second light source 175 for the display of second design 551c is different from the color of first light source 165 for the display of first design 525c. In FIG. 16, a first operational state is a state in which an automatic operation is not executed by a control device, and a second operational state is a state in which the automatic operation is executed by the control device.

The operation of control circuit 210 according to Variation 4 can be explained by reading the operation mode of control circuit 210 in the embodiment as the operational state, and thus detailed description will be omitted.

Figure 17:
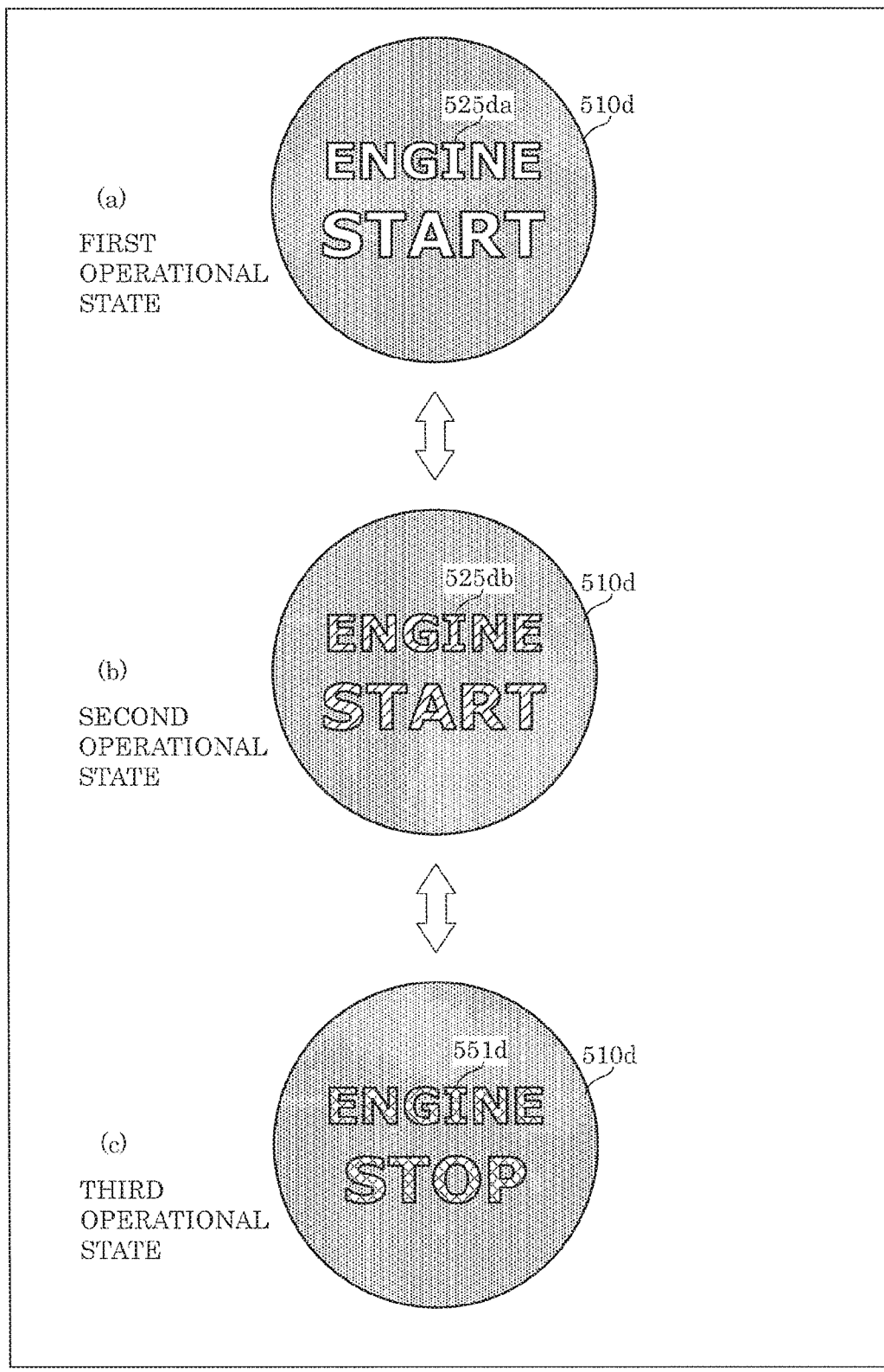
FIG. 17 is a diagram which illustrates another example of a design displayed in the display region according to the operation mode, in the input device according to Variation 4.

In addition, as illustrated in FIG. 17, three states such as a first state in which accessory equipment and an ignition power source of a vehicle are off, a second state in which only the accessory equipment (i.e., on-vehicle device) of the vehicle is on, and a third state in which the accessory equipment and the ignition power source of the vehicle are on may be displayed on front face 510d of the input device. In this case, first design 525da indicates the first state, first design 525db indicates the second state, and second design 551d indicates the third state. In addition, first design 525da and first design 525db have the same shape and different colors. A configuration similar to the configuration of input device 100 described in the embodiment can be used as the configuration of input device 100 according to Variation 4. Input device 100 according to Variation 4 and input device 100 described in the embodiment differ in that, among a plurality of light sources employed as the first light sources, a first light source for displaying first design 525da and a first light source for displaying first design 525db are different in color of light to be emitted. Second design 551d may be displayed in a color different from the color of first design 525da and first design 525db, or may be displayed in the same color. It should be noted that the first light source for displaying first design 525da and the first light source for displaying first design 525db are not limited to be different light sources, but may be the same light source on which color control can be performed.

(1-6-5. Variation 5)

Next, Variation 5 will be described.

Although the foregoing embodiment describes the case where, when switch 155 receives an input, a design which has been displayed before the input is received is switched to a different design, and the different design is displayed, the present disclosure is not limited to this case, and a design displayed may be switched when a predetermined anomaly is detected.

Figure 18:
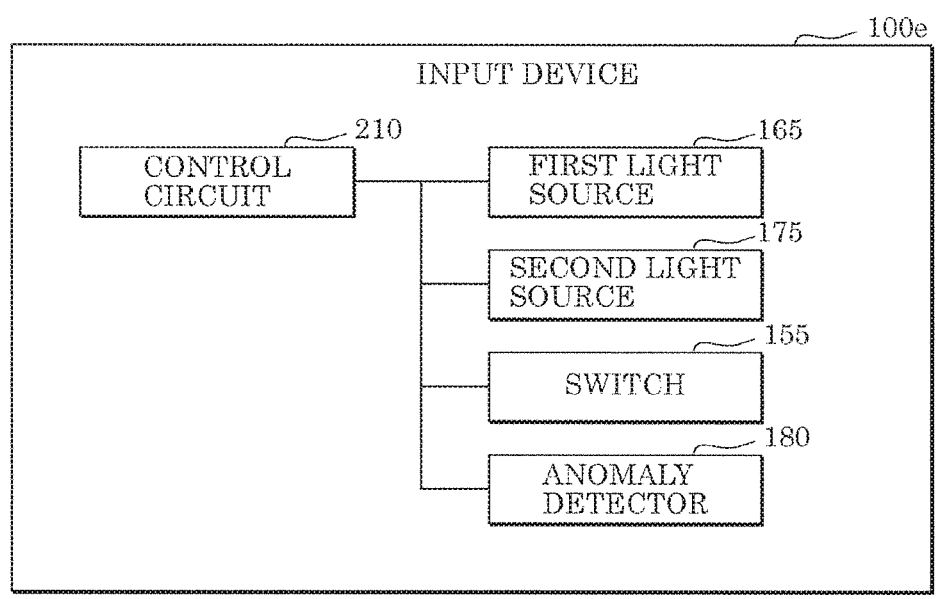
FIG. 18 is a block diagram which illustrates one example of a circuit configuration of an input device according to Variation 5.
Figure 19:
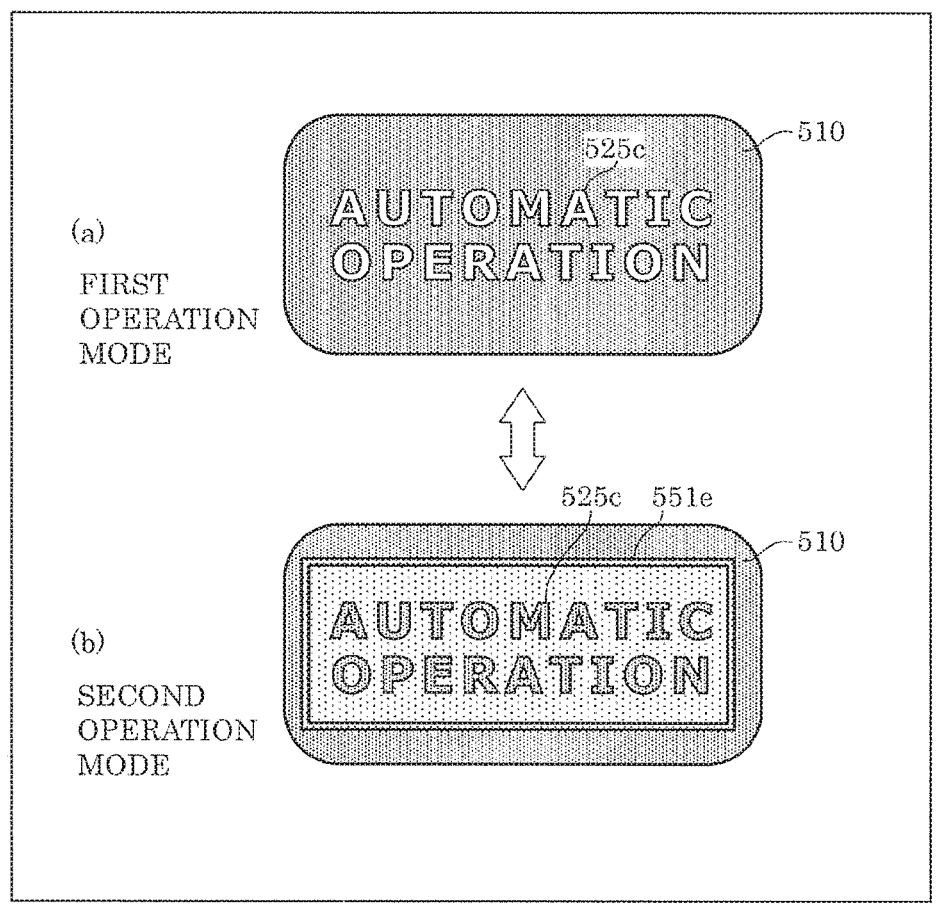
FIG. 19 is a diagram which illustrates one example of a design displayed in a display region according to an operation mode, in the input device according to Variation 5.

FIG. 18 is a block diagram which illustrates one example of a circuit configuration of input device 100e according to Variation 5. FIG. 19 is a diagram which illustrates one example of a design displayed in the display region according to an operational state, in input device 100e according to Variation 5.

Input device 100e includes control circuit 210, first light source 165, second light source 175, switch 155, and anomaly detector 180.

First light source 165, second light source 175, and switch 155 are equivalent to first light source 165, second light source 175, and switch 155 of the embodiment, and thus description for them will be omitted.

Anomaly detector 180 detects occurrence of a predetermined anomaly. More specifically, anomaly detector 180 detects occurrence of a predetermined anomaly related to an operation mode or operational state of an external device indicated by first design 525e, as occurrence of a predetermined anomaly. Examples of the predetermined anomaly include, when a communication function to communicate between an external device that is a control subject and anomaly detector 180 is provided, (i) the case where the external device fails to properly respond to a control signal output by control circuit 210, (ii) the case where the external device and anomaly detector 180 fail to properly communicate with each other, (iii) the case where the external device notifies anomaly detector 180 of anomaly of the external device itself using the communication function, etc.

When anomaly detector 180 detects the predetermined anomaly, control circuit 210 causes second design 551e which indicates occurrence of the predetermined anomaly to be displayed on front face 510, by switching the lighting state of second light source 175 from an off-state to an on-state. The portion corresponding to second design 551e may be located such that second design 551e overlaps with first design 525c, and second design 551e may be displayed as a result of a frame surrounding the portion corresponding to first design 525c and an inside of the frame being illuminated. Control circuit 210 may cause second light source 175 to emit light in the state in which first light source 165 emits light. Control circuit 210 may cause second design 551c to be displayed with emphasis. More specifically, control circuit 210 may cause second design 551e to be displayed with emphasis, by causing second light source 175 to flash or emit light having a color (for example, red, yellow, etc.) or luminance with greater emphasis than a color or luminance of light emitted by first light source 165.

Accordingly, second design 551e which indicates occurrence of a predetermined anomaly can be displayed together with first design 525c, and thus it is possible to notify a user of occurrence of the predetermined anomaly in the operation mode, the operational state, etc. indicated by first design 525c.

In addition, since control circuit 210 causes second design 551e to be displayed with emphasis, it is possible to effectively notify the user of occurrence of the predetermined anomaly.

In addition, since control circuit 210 causes second design 551e to be displayed with emphasis, by causing second light source 175 to flash or emit light having a color or luminance, with greater emphasis than a color of luminance of light emitted by first light source 165, it is possible to effectively notify the user of occurrence of the predetermined anomaly.

It should be noted that the means that indicates occurrence of the predetermined anomaly is not limited to the above-described examples. For example, when anomaly detector 180 detects the predetermined anomaly, the control circuit may execute one of: (i) causing first light source 165 and second light source 175 to concurrently emit light; (ii) causing first light source 165 and second light source 175 to concurrently flash light; and (iii) causing first light source 165 and second light source 175 to alternately flash light. In this manner as well, it is possible to effectively notify a user of occurrence of the predetermined anomaly.

(1-7. Others)

Although switch 155 is disposed inside the display device including first light source 165 and second light source 175 in the forgoing embodiment, the display device including first light source 165 and second light source 175 may be formed independently of the switch. In this case, the display device communicates with the switch to receive an input signal indicating an input to the switch.

In addition, the input device may be implemented as an input device which includes, among the structural components included in input device 100 according to the foregoing embodiment, second operation unit 117, first light source 165, second light source 175, switch 155, and control circuit 210.

Although the foregoing embodiment describes the case where the external device is a control device for controlling a driving operation of a vehicle, an operation of an on-vehicle device, etc., the present disclosure is not limited to this example, and may be a car navigation system, a video device, audio equipment, an air conditioning device, etc.

Although the input device according to one or more aspects of the present disclosure has been described above based on the embodiment, the present disclosure is not limited to the above-described embodiment. Other forms in which various modifications apparent to those skilled in the art are applied to the embodiment, or forms structured by combining structural components of different embodiments may be included within the scope of one or more aspects of the present disclosure, unless such changes and modifications depart from the scope of the present disclosure.

While various embodiments have been described herein above, it is to be appreciated that various changes in form and detail may be made without departing from the spirit and scope of the present disclosure as presently or hereafter claimed.

FURTHER INFORMATION ABOUT TECHNICAL BACKGROUND TO THIS APPLICATION

The disclosure of the following Japanese Patent Application including specification, drawings and claims are incorporated herein by references on their entirety: Japanese Patent Application No. 2018-031103 filed on Feb. 23, 2018.

INDUSTRIAL APPLICABILITY

The present disclosure is useful as an input device, etc. capable of reducing a false operation by a user.

What is claimed is:

1. An input device, comprising:
a first light source which emits light to cause a first design to be displayed on a display region;
a second light source which emits light to cause a second design different from the first design to be displayed on the display region;
a switch which receives an input from a user; and
a control circuit which, according to the input received by the switch, (i) controls displaying of a design on the display region, by controlling a lighting state of the first light source and a lighting state of the second light source, and (ii) outputs a control signal corresponding to the input received by the switch, to an external device which operates in one of a first operation mode and a second operation mode, wherein:
the first design indicates that an operation mode of the external device is to be switched to the first operation mode different from the current operation mode when the input is received next time by the switch, and
when the switch receives the input while the first light source is in an on-state, the control circuit (i) turns off display of the first design by switching the lighting state of the first light source from the on-state to an off-state, and (ii) outputs the control signal for switching the operation mode to the first operation mode, to the external device.

2. An input device comprising:
a first light source which emits light to cause a first design to be displayed on a display region;
a second light source which emits light to cause a second design different from the first design to be displayed on the display region;
a switch which receives an input from a user; and
a control circuit which, according to the input received by the switch, (i) controls displaying of a design on the display region, by controlling a lighting state of the first light source and a lighting state of the second light source, and (ii) outputs a control signal corresponding to the input received by the switch, to an external device which operates in one of a first operation mode and a second operation mode, wherein:
the first design indicates that the external device is currently operating in the first operation mode,
the second design indicates that the external device is currently operating in the second operation mode, and
when the switch receives the input while both the first design and the second design are displayed with emphasis on the first design, the control circuit (i) switches a design displayed with emphasis from the first design to the second design, and (ii) outputs the control signal for switching the operation mode to the second operation mode, to the external device.

3. The input device according to claim 2, wherein
the control circuit switches the design displayed with emphasis on the display region from the first design to the second design, by switching the lighting state of the first light source and the lighting state of the second light source from a first state to a second state, the first state being a state in which the first light source is caused to emit light having a color or luminance with greater emphasis than a color or luminance of light emitted by the second light source, the second state being a state in which the second light source is caused to emit light having a color or luminance with greater emphasis than a color or luminance of light emitted by the first light source.

4. An input device comprising:
a first light source which emits light to cause a first design to be displayed on a display region;
a second light source which emits light to cause a second design different from the first design to be displayed on the display region;
a switch which receives an input from a user; and
a control circuit which, according to the input received by the switch, (i) controls displaying of a design on the display region, by controlling a lighting state of the first light source and a lighting state of the second light source, and (ii) outputs a control signal corresponding to the input received by the switch, to an external device which operates in one of a first operation mode and a second operation mode, wherein:
the first design indicates that a first control in the first operation mode is to be executed by the external device,
the second design indicates that a second control in the second operation mode is to be executed by the external device, and
while the first light source is in an on-state, the control circuit:
(i) when the switch receives an input by being continuously pressed or touched for a predetermined period or longer, (i-i) switches a design displayed on the display region from the first design to the second design, by switching the lighting state of the first light source from the on-state to an off-state and switching the lighting state of the second light source from the off-state to the on-state, and (i-ii) outputs a control signal for switching the operation mode to the second operation mode, to the external device; and
(ii) when the switch receives an input by being continuously pressed or touched for less than the predetermined period, outputs a control signal for causing the first control to be executed, to the external device.

5. The input device according to claim 1, further comprising:
an anomaly detector which detects occurrence of a predetermined anomaly, wherein
when the anomaly detector detects the predetermined anomaly, the control circuit executes one of (i) causing the first light source and the second light source to concurrently emit light, (ii) causing the first light source and the second light source to concurrently flash, and (iii) causing the first light source and the second light source to alternately flash.

6. The input device according to claim 1, wherein
the display device including the first light source and the second light source is formed independently of the switch, and
the display device communicates with the switch to receive an input signal indicating an input to the switch.

7. The input device according to claim 1, wherein
the switch is disposed inside the display device including the first light source and the second light source.

8. The input device according to claim 2, further comprising:
an anomaly detector which detects occurrence of a predetermined anomaly, wherein
when the anomaly detector detects the predetermined anomaly, the control circuit executes one of (i) causing the first light source and the second light source to concurrently emit light, (ii) causing the first light source and the second light source to concurrently flash, and (iii) causing the first light source and the second light source to alternately flash.

9. The input device according to claim 2, wherein
the display device including the first light source and the second light source is formed independently of the switch, and
the display device communicates with the switch to receive an input signal indicating an input to the switch.

10. The input device according to claim 2, wherein
the switch is disposed inside the display device including the first light source and the second light source.

11. The input device according to claim 4, further comprising:
an anomaly detector which detects occurrence of a predetermined anomaly, wherein
when the anomaly detector detects the predetermined anomaly, the control circuit executes one of (i) causing the first light source and the second light source to concurrently emit light, (ii) causing the first light source and the second light source to concurrently flash, and (iii) causing the first light source and the second light source to alternately flash.

12. The input device according to claim 4, wherein
the display device including the first light source and the second light source is formed independently of the switch, and
the display device communicates with the switch to receive an input signal indicating an input to the switch.

13. The input device according to claim 4, wherein
the switch is disposed inside the display device including the first light source and the second light source.

* * * * *